United States Patent
Fujisawa et al.

(10) Patent No.: US 10,604,612 B2
(45) Date of Patent: Mar. 31, 2020

(54) CURABLE ORGANOPOLYSILOXANE COMPOSITION, SEMICONDUCTOR SEALANT COMPRISING SAME, AND SEMICONDUCTOR DEVICE

(71) Applicant: Dow Corning Toray Co., Ltd., Tokyo (JP)

(72) Inventors: Toyohiko Fujisawa, Chiba (JP); Nohno Toda, Chiba (JP); Ryosuke Yamazaki, Chiba (JP)

(73) Assignee: Dow Toray Co., Ltd., Tokyo (JP)

( * ) Notice: Subject to any disclaimer, the term of this patent is extended or adjusted under 35 U.S.C. 154(b) by 0 days.

(21) Appl. No.: 15/539,204

(22) PCT Filed: Dec. 17, 2015

(86) PCT No.: PCT/JP2015/006286
§ 371 (c)(1),
(2) Date: Jun. 23, 2017

(87) PCT Pub. No.: WO2016/103654
PCT Pub. Date: Jun. 30, 2016

(65) Prior Publication Data
US 2017/0355804 A1 Dec. 14, 2017

(30) Foreign Application Priority Data
Dec. 26, 2014 (JP) .................................. 2014-266535

(51) Int. Cl.
| | | |
|---|---|---|
| *C08F 299/08* | (2006.01) | |
| *C08K 5/14* | (2006.01) | |
| *C08G 77/20* | (2006.01) | |
| *C08L 83/04* | (2006.01) | |
| *C09J 151/08* | (2006.01) | |
| *C08F 283/12* | (2006.01) | |
| *H01L 33/56* | (2010.01) | |
| *C08G 77/16* | (2006.01) | |
| *C08G 77/12* | (2006.01) | |
| *H01L 33/60* | (2010.01) | |
| *H01L 33/50* | (2010.01) | |
| *C08G 77/14* | (2006.01) | |

(52) U.S. Cl.
CPC .......... *C08F 299/08* (2013.01); *C08F 283/12* (2013.01); *C08G 77/20* (2013.01); *C08K 5/14* (2013.01); *C08L 83/04* (2013.01); *C09J 151/085* (2013.01); *C08G 77/12* (2013.01); *C08G 77/14* (2013.01); *C08G 77/16* (2013.01); *H01L 33/501* (2013.01); *H01L 33/56* (2013.01); *H01L 33/60* (2013.01)

(58) Field of Classification Search
CPC .................. C08G 77/12; C08G 77/20
See application file for complete search history.

(56) References Cited

U.S. PATENT DOCUMENTS

| | | | | |
|---|---|---|---|---|
| 3,183,205 A | * | 5/1965 | Bailey ...................... | C08K 5/14 252/73 |
| 2004/0116640 A1 | | 6/2004 | Miyoshi | |
| 2005/0212008 A1 | | 9/2005 | Miyoshi | |
| 2007/0218299 A1 | | 9/2007 | Azechi | |
| 2008/0308828 A1 | | 12/2008 | Kashiwagi et al. | |
| 2010/0276721 A1 | * | 11/2010 | Yoshitake ............... | C08L 83/00 257/99 |
| 2011/0092647 A1 | | 4/2011 | Morita et al. | |
| 2011/0248312 A1 | | 10/2011 | Katayama | |
| 2015/0158982 A1 | | 6/2015 | Saito et al. | |
| 2016/0204319 A1 | * | 7/2016 | Swier ...................... | C08L 83/04 428/339 |

FOREIGN PATENT DOCUMENTS

| | | | |
|---|---|---|---|
| JP | H01126317 | A | 5/1989 |
| JP | H0565414 | A | 3/1993 |
| JP | H10195085 | A | 7/1998 |
| JP | 2004186168 | A | 7/2004 |
| JP | 2007191629 | A | 8/2007 |
| JP | 2007231195 | A | 9/2007 |
| JP | 2007246842 | A | 9/2007 |
| JP | 2007302829 | A | 11/2007 |
| JP | 2009235368 | A | 10/2009 |
| JP | 2009242627 | A | 10/2009 |
| JP | 2011219597 | A | 11/2011 |
| WO | WO2013021717 | A1 | 2/2013 |
| WO | 2014100652 | * | 6/2014 |

OTHER PUBLICATIONS

Lin (International Scholar and Scientific Research & Innovation 8(7) (2014) 687-691).*
FFinstruments (Oscillating Disc Rheometer (2003) pp. 1-20).*
Rosato (Plastic Product Material and Process Selection Handbook, Elsevier (2004) pp. 512-549).*
PCT/JP2015/006286 International Search Report dated Mar. 15, 2016, 2 pages.
English language abstract and machine translation for JPH01126317 (A) extracted from http://worldwide.espacenet.com database on Aug. 31, 2017, 11 pages.
English language abstract and machine translation for JPH0565414 (A) extracted from http://worldwide.espacenet.com database on Aug. 31, 2017, 26 pages.
English language abstract and machine translation for JPH10195085 (A) extracted from http://worldwide.espacenet.com database on Aug. 31, 2017, 21 pages.

(Continued)

*Primary Examiner* — Kuo Liang Peng
(74) *Attorney, Agent, or Firm* — Warner Norcross + Judd LLP

(57) ABSTRACT

Disclosed is a curable organopolysiloxane composition, comprising: (A) a curing reactive organopolysiloxane component formed by curing or semi-curing and reacting at least two or more types of organopolysiloxanes in the presence of one or more types of catalysts; and (B) a peroxide. The composition is a non-fluid at 25° C., and the melt viscosity at 100° C. is 8000 Pa·s or lower. A sealing agent comprising the curable organopolysiloxane composition and a cured product of the curable organopolysiloxane composition are also disclosed, along with a method of molding a cured product and a semiconductor device comprising the cured product.

18 Claims, No Drawings

(56) References Cited

OTHER PUBLICATIONS

English language abstract and machine translation for JP2007191629 (A) extracted from http://worldwide.espacenet.com database on Aug. 31, 2017, 26 pages.
English language abstract and machine translation for JP2007231195 (A) extracted from http://worldwide.espacenet.com database on Aug. 31, 2017, 19 pages.
English language abstract and machine translation for JP2007302829 (A) extracted from http://worldwide.espacenet.com database on Aug. 31, 2017, 20 pages.

* cited by examiner

CURABLE ORGANOPOLYSILOXANE COMPOSITION, SEMICONDUCTOR SEALANT COMPRISING SAME, AND SEMICONDUCTOR DEVICE

CROSS-REFERENCE TO RELATED APPLICATIONS

This application is the National Stage of International Application No. PCT/JP2015/006286 filed on 17 Dec. 2015, which claims priority to and all advantages of Japanese Patent Application No. 2014-266535 filed on 26 Dec. 2014, the contents of which are incorporated herein by reference.

TECHNICAL FIELD

The present invention relates to a curable organopolysiloxane composition, a sealing agent for a semiconductor containing the curable organopolysiloxane composition, and a semiconductor device sealed using same.

BACKGROUND ART

Curable organopolysiloxane compositions cure to form cured products having excellent heat resistance, cold resistance, electrical insulating properties, weather resistance, water repellency, and transparency, and therefore, the compositions are used in a wide range of industrial fields. In particular, cured products thereof are less likely to be discolored compared to other organic materials, and have reduced degradation of physical properties, and therefore are suitable as optical materials. For example, Patent Literature 1 proposes a liquid silicone resin composition for a light-emitting diode (LED) element, containing a silicone resin containing an alkenyl group, an organopolysiloxane containing a silicon-bonded hydrogen atom, and a catalyst for a hydrosilylation reaction.

Furthermore, the required performance of power semiconductors has been steadily increasing in recent years, and the required power density is in a difficult-to-achieve region with a conventional Si device. In these cases, higher power density is required, and a SiC power device is suggested as a device being developed in recent years. However, in order to achieve higher power density, driving must be possible even in high temperature conditions where the temperature of the chip surface during operation is 250° C. Therefore, there is strong demand for development of a sealing material that can withstand those temperatures and can maintain physical properties over a long period of time.

On the other hand, materials that are solid or semi-solid at room temperature have been proposed in recent years for new LED manufacturing processes. For example, Patent Literature 2 includes a sheet silicone resin composition for a light-emitting diode (LED), containing a silicone resin containing an alkenyl group, an organopolysiloxane containing a silicon-bonded hydrogen atom, and a catalyst for a hydrosilylation reaction; Patent Literature 3 includes a curable organopolysiloxane composition containing a solvent-soluble organopolysiloxane containing an alkenyl group, an organopolysiloxane containing a silicon-bonded hydrogen, and a catalyst for a hydrosilylation reaction, produced by a hydrosilylation reaction between the organopolysiloxane containing an alkenyl group and organopolysiloxane containing a silicon-bonded hydrogen atom; and Patent Literature 4 includes a silicone resin sheet formed by semi-curing a silicone resin composition containing an organopolysiloxane having at least two alkenylsilyl groups in one molecule, an organopolysiloxane having at least two hydrosilyl groups in one molecule, and a catalyst for a hydrosilylation reaction, and a reaction suppressant. However, the materials have problems where surface pressure-sensitive adhesion at 25° C. is provided, but hot melt properties are not sufficient, and thus is insufficient for practical applications. Furthermore, these materials have a problem where the hardness and physical strength are insufficient, and in particular, when exposed to a high temperature of 250° C. or higher, strength degradation is less likely to occur.

On the other hand, Patent Literature 5 proposes using both a hydrosilylation reaction catalyst and peroxide curing reaction in a heat curable composition containing an organopolysiloxane, but the composition is a pressure-sensitive adhesive, and there is no mention nor suggestion of a curable organopolysiloxane composition having hot melt properties. In particular, there is no mention nor suggestion of synthesizing an organopolysiloxane having a reactive functional group in advance by a curing reaction or semi-curing reaction.

CITATION LIST

Patent Literature

Patent Literature 1: Japanese Unexamined Patent Application No. 2004-186168
Patent Literature 2: Japanese Unexamined Patent Application No. 2009-235368
Patent Literature 3: Japanese Unexamined Patent Application No. 2009-242627
Patent Literature 4: Japanese Unexamined Patent Application No. 2011-219597
Patent Literature 5: Japanese Unexamined Patent Application No. 2007-246842

SUMMARY OF INVENTION

Technical Problem

An object of the present invention is to provide: a curable organopolysiloxane composition that is non-fluid at 25° C., has reduced surface pressure-sensitive adhesion, cures in a short period of time while providing hot melt properties of easily melting by heating, has excellent physical strength in an initial cured product, is less likely to crack during curing, has a low coefficient of thermal expansion in an obtained cured product, and maintains high physical strength even if exposed to a high temperature of 250° C. or higher. Another object of the present invention is to further provide a sealing agent for a semiconductor and semiconductor device, containing the curable organopolysiloxane composition.

Solution to Problem

A curable organopolysiloxane composition according to the present invention is a curable organopolysiloxane composition, containing: (A) a curing reactive organopolysiloxane component formed by curing or semi-curing and reacting at least two or more types of organopolysiloxanes in the presence of one or more types of catalysts; and (B) a peroxide, wherein the composition is non-fluid at 25° C., and the melt viscosity at 100° C. is 8000 Pa·s or lower. The curing or semi-curing reaction is preferably a semi-curing reaction of two or more types of organopolysiloxanes in the presence of one or more curing catalysts selected from (a1) hydrosilylation reaction catalysts, (a2), condensation reaction catalysts, (a3) peroxides, and (a4) high energy beam curing catalysts, and the organopolysiloxane obtained by the semi-curing reaction is particularly preferably a curing reactive organopolysiloxane having a reactive functional group containing a carbon-carbon double bond such as at least two alkenyl groups or the like in one molecule. Note that so long as the component (A) is independently synthesized, the curing or semi-curing reaction for obtaining the component (A) may be one or more types (so-called duel curing reaction) of any one of a hydrosilylation reaction, condensation reaction, addition reaction, high energy beam curing reaction, and may be performed in the presence of the peroxide (B).

The curable organopolysiloxane composition of the present invention is cured by the peroxide (B), but the physical properties of the cured product are determined by the siloxane unit in the component (A). Specifically, a resin organopolysiloxane having a plurality of branched siloxane units provides hardness and mechanical strength on a cured product, and the obtained organopolysiloxane having a plurality of chain siloxane units provides toughness on a cured product, and therefore, the component (A) preferably has a three-dimensional resin (resin form) siloxane structure and chain (including straight chain or branched chain) siloxane structure, based on the physical strength and curability of the cured product, and that high physical strength can be maintained even if exposed to a high temperature of 250° C. or higher. An organosilicon compound having this structure can be obtained by a curing reaction or semi-curing between the curing reactive resin organopolysiloxane and curing reactive chain organopolysiloxane in the presence of a curing catalyst, at a ratio designed such that a reactive functional group remains.

In particular, the peroxide (B) of the curable organopolysiloxane composition of the present invention is preferably an organic peroxide with a 10 hour half-life temperature of 90° C. or higher.

Furthermore, the curable organopolysiloxane composition of the present invention preferably contains (C) an inorganic filler, and may contain one or more type selected from reaction suppressants, adhesion imparting agents, and heat resistance imparting agents.

For the hot melt properties, the curable organopolysiloxane composition of the present invention preferably has a softening point within a range of 25° C. to 100° C. and hot melt properties, and particularly preferably has a melt viscosity at 100° C. of 500 to 8000 Pa·s.

Furthermore, for the curing properties of the curable organopolysiloxane composition of the present invention, when the torque value at 180° C./3 minutes is 100%, the time to reach 90% is preferably less than 2 minutes and 30 seconds, the type D durometer hardness at 25° C. of a cured product obtained by curing is preferably 60 or higher, and the coefficient of linear expansion of the cured product is preferably 100 ppm/° C. or lower.

The curable organopolysiloxane composition and cured product thereof can be suitably used as a sealing agent for a semiconductor. In other words, the sealing agent for a semiconductor of the present invention contains the curable organopolysiloxane composition, and the semiconductor of the present invention contains the cured product formed by curing the curable organopolysiloxane composition. Note that the semiconductor of the present invention is particularly preferably a power semiconductor.

The curable organopolysiloxane composition can be suitably used as a transfer molding material utilizing hot melt properties. In particular, the present invention relates to a method of molding an organopolysiloxane cured product, at least including the steps of:

(I) heating and melting at 100° C. or higher to fluidize the curable organopolysiloxane composition according to any one of claims 1 through 12;

(II) flowing into a metal die the melted curable organopolysiloxane composition of step (I); and (III) curing the entire body by peroxide curing and reacting at 150° C. or higher.

Advantageous Effects of Invention

The curable organopolysiloxane composition of the present invention is non-fluid at 25° C., has reduced surface pressure-sensitive adhesion, and has favorable hot melt properties of easily melting by heating. Furthermore, the curable organopolysiloxane composition of the present invention is cured in a short period of time, has excellent physical strength of an initial cured product, is less likely to crack during curing, and has a reduced coefficient of thermal expansion of the obtained cured product, and therefore particularly has an advantage of excellent handling workability when performing transfer molding using a metal die. Furthermore, the curable organopolysiloxane composition of the present invention has high initial hardness, and the physical strength is not greatly reduced even if exposed to a high temperature of 250° C. or higher. Therefore, if used as a sealing agent or potting agent of various semiconductors including light-emitting diodes (LED) and power semiconductors, advantages are provided such as excellent handling workability and the capability to significantly improve the durability and reliability of the semiconductor, even under conditions exposed to high output/high temperatures.

DESCRIPTION OF EMBODIMENTS

A curable organopolysiloxane composition according to the present invention contains: (A) a curing reactive organopolysiloxane component formed by curing or semi-curing and reacting at least two or more types of organopolysiloxanes in the presence of one or more types of catalysts; (B) a peroxide; and (C) an arbitrary component such as an inorganic filler or the like, wherein the composition as a whole is non-fluid at 25° C., and the melt viscosity at 100° C. is 8000 Pa·s or lower. The properties of the components and composition are described below.

[Component (A)]

The component (A) of the present invention is a curing reactive organopolysiloxane component, and is a component that provides favorable hot melt properties to the composition of the present invention, and provides an available cured product as a sealing agent/potting agent or the like of a semiconductor or the like by curing by the peroxide (B) and optionally, one or more types of curing catalysts (X) other than the peroxide.

In the present invention, the curing reactive organopolysiloxane component is a reaction product formed by curing or semi-curing and reacting at least two or more types of organopolysiloxanes in the presence of one or more types of catalysts, and has a curing reactive functional group in a molecule. The composition according to the present invention can implement favorable hot melt properties by using the aforementioned cured/semi-cured reaction product as the curing reactive organopolysiloxane component, and has properties where cracks are less likely to occur, and the coefficient of thermal expansion of the obtained cured product is reduced when cured by the peroxide (B) and optionally, one or more types of curing catalysts (X) other than the peroxide. In other words, in the present invention, the curing reactive organopolysiloxane component is a reaction product obtained by reacting in advance two or more types of organopolysiloxanes, and provides significantly improved hot melt properties to the composition, curability, physical strength of the cured product, and the like, as compared to completely curing an individual organopolysiloxane raw material by the peroxide (B) and the like.

The component (A) is preferably a semi-curing reaction of two or more types of organopolysiloxanes in the presence of one or more curing catalysts selected from (a1) hydrosilylation reaction catalysts, (a2), condensation reaction catalysts, (a3) peroxides, and (a4) high energy beam curing catalysts, and the organopolysiloxane obtained by the semi-curing reaction is particularly preferably a curing reactive organopolysiloxane component having at least two reactive functional groups in one molecule.

The organopolysiloxane has in a molecule at least two reactive groups curable by the peroxide (B) and one or more types of curing catalyst (X) other than the peroxide. The reactive groups are not particularly restricted, and examples include: alkenyl groups, acrylic groups, silicon-bonded hydrogen atoms, and other hydrosilylation reactive functional groups; hydroxyl groups, alkoxy groups, acyloxy groups, and other condensation reactive functional groups; alkyl groups, alkenyl groups, acrylic groups, hydroxyl groups, and other peroxide curing reactive functional groups/high energy beam curing reactive functional groups. The organopolysiloxane particularly preferably has a reactive functional group containing a carbon-carbon double bond, and is a carbon-carbon double bond alkenyl group or acrylic group; the alkenyl group is particularly preferred. Note that if a dual curing type with different curing systems is used, a curable functional group selected from silicon-bonded hydrogen atoms and condensation reactive functional groups, namely a hydroxy group or alkoxy group, may be further provided.

From the perspective of hot melt properties of the composition according to the present invention, the curing reactive organopolysiloxane component preferably contains a semi-cured reaction product of at least one type of resin (resin form) organopolysiloxane and chain (including straight chain and branched chain) organopolysiloxane. Preferred examples of the semi-curing reaction include: condensation reactions involving a hydroxy group or alkoxy group; hydrosilylation reactions involving an alkenyl group and silicon-bonded hydrogen atom; and peroxide curing reactions involving an alkenyl group and one or more types of a group selected from alkyl groups and alkenyl groups. Herein, semi-curing reaction refers to a curing reaction with the purpose of reacting only a portion of a curving reactive functional group in a raw material organopolysiloxane such that a group that can be cure reacted by a later-described component (B) and other optional curing catalyst (X) remains in the curing reactive organopolysiloxane component that is component (A). The curing reactive organopolysiloxane component that is used is obtained by the partial curing reaction, and providing a resin organopolysiloxane structure—chain organopolysiloxane structure in a molecule, and therefore, the composition according to the present invention exhibits favorable hot melt properties, and based on the component (B) and optional other curing catalyst (X), exhibits favorable curability. The degree of the semi-curing reaction can be selected based on desired properties, but is preferably selected within a range of 10 mol % to 90 mol % of the entire raw material organopolysiloxane.

The curing reactive organopolysiloxane component particularly preferably has an alkylene bond between a resin organopolysiloxane structure—chain organopolysiloxane structure in a molecule, and has at least two or more alkenyl groups in a molecule, by semi-curing by a hydrosilylation reaction or the like. Similarly, the organopolysiloxane particularly preferably has a siloxane bond between a resin organopolysiloxane structure—chain organopolysiloxane structure in a molecule, and has at least two or more alkenyl groups in a molecule, through semi-curing by condensation curing. This is because the hot melt properties significantly improve due to a structure in which a portion of the organopolysiloxane of the resin structure—chain structure is crosslinked by an alkylene group or new siloxane (—Si—O—Si) bond, and final curing properties are improved by the peroxide (B) by providing at least two or more alkenyl groups in a molecule.

Furthermore, the curing reactive organopolysiloxane component has a siloxane bond between the resin organopolysiloxane structure—chain organopolysiloxane structure in a molecule through a semi-curing reaction by a peroxide, and has a reactive functional group such as at least two or more alkenyl groups in a molecule, which is a preferred embodiment of the present invention. For example, a peroxide curing reaction may be performed by adding a small amount of a peroxide apart from the component (B) described later to the resin (resin form) organopolysiloxane having at least one type of alkenyl group and the chain (including straight chain and branched chain) organopolysiloxane to obtain a curing reactive organopolysiloxane having a reactive functional group such as an alkenyl group or the like in a molecule. Note that if an individual organopolysiloxane raw material is completely cured by a peroxide or the like in place of the curing reactive organopolysiloxane that is the aforementioned component (A), the technical effects of the present invention are not achieved or are extremely insufficient.

The curing reactive organopolysiloxane component having a reactive functional group of at least two alkenyl groups or the like in a molecule, and having a resin structure—chain structure in a molecule is described below.

The component (A) is preferably a curing reactive organopolysiloxane composition in which a portion of the organopolysiloxane of the resin structure—chain structure is cross-linked by an alkenyl group or siloxane bond, and has a reactive functional group such as an alkenyl group or the like bonded to a silicon atom, and is a component providing the composition with hot melt properties, and based on the peroxide, curability and high temperature durability. Note that for the following description, the alkenyl group or siloxane bound between the resin organopolysiloxane structure—chain organopolysiloxane structure is referred to as a "crosslinking group between Si structures".

The curing reactive organopolysiloxane component may be prepared in advance, or may be reacted in advance at a lower temperature than the curing reaction temperature by the peroxide (B), by mixing raw material components described later at a reaction ratio designed such that the crosslinking group between Si structures (=alkylene group or a siloxane bond derived from a condensation reaction) and a reactive functional group such as an alkenyl group or the like remain in a molecule.

The component (A) is an organopolysiloxane having a crosslinking group between Si structures selected from new siloxane (—Si—O—Si) bonds derived from the condensation reaction, and a reactive functional group such as an alkenyl group with 2 to 20 carbon atoms, bonded to a silicon atom. The component has an alkylene/polysiloxane structure in which a chain or resin polysiloxane structure is bonded by the crosslinking group between Si structures, and has a reactive functional group such as an alkenyl group or the like where a thermal curing reaction is possible by a peroxide. By providing the structure, the component (A) has advantages of being non-fluid, having reduced surface pressure-sensitive adhesion, and having a sufficiently low melt viscosity at high temperatures, while maintaining flexibility at 25° C., as compared to a conventional known hot melt silicone material, and thermal curing is possible by the peroxide (B) by a reactive functional group such as a remaining alkenyl group or the like. Therefore, the component has advantages where cracking is less likely to occur during curing, the coefficient of thermal expansion of an obtained cured product is reduced, initial hardness is high, and physical strength does not greatly deteriorate even if exposed to a high temperature of 250° C. or higher.

From the perspective of the aforementioned hot melt properties and thermal curability by the peroxide (B), the ratio of [alkylene group content (mol %)]/[alkenyl group content (mol %)] in the component (A) may be within a range of 0.2 to 5.0, and preferably within a range of 0.2 to 4.0. When the ratio is less than the lower limit, the amount of the alkenyl group may be excessive, and physical properties such as initial hardness, strength, and the like may be insufficient. On the other hand, when the ratio exceeds the upper limit, high temperature durability and thermal curability by the peroxide (B) may be insufficient. The content of the alkenyl group in the component (A) (mol % of alkenyl group included in the entire silicon-bonded functional group in the component (A)) can be designed as needed, but may be within a range of 0.20 to 5.00 mol %, and preferably 0.40 to 5.00 mol % from the perspective of high temperature durability and thermal curability by the peroxide (B). This is because when the content of the alkenyl group is less than the lower limit, the thermal curability by the peroxide (B) may be insufficient, and when the content exceeds the upper limit, the content of the alkenyl group may be excessive, and physical properties such as initial harness of a cured product, strength, and the like may be impaired.

The component (A) can be obtained by a hydrosilylation reaction between an organopolysiloxane having at least two alkenyl groups in one molecule and an organopolysiloxane having at least two silicon-bonded hydrogen atoms in one molecule at a reaction ratio of [molar number of alkenyl groups]/[molar number of silicon-bonded hydrogen atoms]>1.

Similarly, the component (A) can be obtained by a peroxide curing reaction between at least two or more types of organopolysiloxanes having at least two alkenyl groups in one molecule, and optionally an organopolysiloxane having at least two silicon-bonded hydrogen atoms in one molecule, in the presence of a peroxide at an amount insufficient for all alkenyl groups in a system to react. Note that the two types of reaction may be used in combination.

The alkenyl group in the reaction raw material forms a silalkylene bond between polysiloxane by a hydrosilylation reaction between silicon-bonded hydrogen atoms or by a peroxide curing reaction between two types of organopolysiloxanes containing an alkenyl group, but on the other hand, excess alkenyl groups are used in a thermal curing reaction by the peroxide (B) as a silicon-bonded alkenyl group in the component (A) which is an obtained semi-cured reaction product.

Examples of the alkenyl group in the component (A) include vinyl groups, allyl groups, butenyl groups, pentenyl groups, hexenyl groups, heptenyl groups, octenyl groups, nonenyl groups, decenyl groups, undecenyl groups, dodecenyl groups, and other alkenyl groups with 2 to 20 carbon atoms, and these may be straight chained or branched; and vinyl groups and hexenyl groups are preferred. Similarly, examples of the alkylene groups include ethylene groups, propylene groups, butylene groups, pentylene groups, hexylene groups, and other alkenyl groups with 2 to 20 carbon atoms, and these may be straight chained or branched; and ethylene groups and hexylene groups are preferred.

On the other hand, examples of the group bonded to a silicon atom other than the alkenyl group in the component (A) include alkyl groups with 1 to 20 carbon atoms, halogen-substituted alkyl groups with 1 to 20 carbon atoms, aryl groups with 6 to 20 carbon atoms, halogen-substituted aryl groups with 6 to 20 carbon atoms, hydroxyl groups, alkoxy groups, and groups containing an epoxy group, and particular examples include: methyl groups, ethyl groups, propyl groups, butyl groups, pentyl groups, hexyl groups, heptyl groups, octyl groups, nonyl groups, decyl groups, undecyl groups, dodecyl groups, and the other alkyl groups; phenyl groups, tolyl groups, xylyl groups, naphthyl groups, anthracenyl groups, phenanthryl groups, pyrenyl groups, and other aryl groups with 6 to 20 carbon atoms; groups substituting a portion or all hydrogen atoms bonded to these groups with a chlorine atom, bromine atom, or other halogen atom; groups containing an epoxy group as expressed by the following structure formula. Methyl groups, phenyl groups, glycidoxypropyl groups, and hydroxyl groups are particularly preferred. Note the groups containing an epoxy group such as a glycidoxypropyl group or the like are functional groups used in an adhesion imparting agent, and the component (A) after a semi-curing reaction has the groups containing an epoxy group, and therefore, adhesion and curing bonding of a cured product obtained by the component (B) may be further improved.

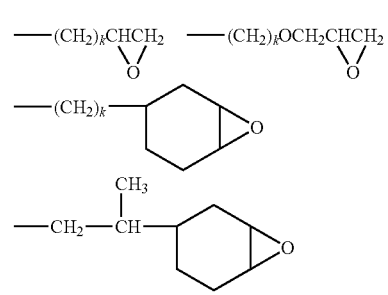

[Formula 1]

(Where k represents a number from 1 to 10, and particularly 2 to 8.)

Furthermore, 10 mol % or more, and preferably 20 mol % or more of monovalent organic groups bonded to a silicon atom is an aryl group, and preferably a phenyl group, and therefore, the component (A) can provide a curable composition that contains a hot meltable organosilicon compound that is non-fluid at 25° C. and has reduced surface pressure-sensitive adhesion.

A siloxane unit configuring the component (A) or siloxane unit containing a silalkylene group is not particularly restricted, but in order to provide sufficient hardness and mechanical properties to the obtained cured product, both a straight chain polysiloxane unit and resin polysiloxane unit are preferably provided in the same molecule. The organosilicon compound is preferably configured by the following siloxane units and siloxane units containing a silalkylene group.

M unit: Siloxane unit as expressed by $R^1R^2{}_2SiO_{0.5}$,

D unit: Siloxane unit as expressed by $R^1R^2SiO_{1.0}$, $R^3M/R^3D$ unit: At least one type of siloxane unit selected from a siloxane unit containing a silalkylene group as expressed by $R^3{}_{0.5}R^2{}_2SiO_{0.5}$ and siloxane unit containing a silalkylene group as expressed by $R^3{}_{0.5}R^2SiO_{1.0}$, and T/Q unit: At least one type of siloxane unit selected from a siloxane unit as expressed by $R^2SiO_{1.5}$ and siloxane unit as expressed by $SiO_{2.0}$ In the formulas, $R^1$ independently represents a monovalent hydrocarbon group with 1 to 20 carbon atoms, and examples include: alkenyl groups with 2 to 20 carbon atoms; alkyl groups with 1 to 20 carbon atoms; halogen-substituted alkyl groups with 1 to 20 carbon atoms; aryl groups with 6 to 20 carbon atoms; halogen-substituted aryl groups with 6 to 20 carbon atoms; aralkyl groups with 7 to 20 carbon atoms, and groups containing an alkoxy group, hydroxyl group, or an epoxy group as expressed by the aforementioned structural formula. However, of all of the siloxane units, at least one $R^1$ is an alkenyl group with 2 to 20 carbon atoms, and examples include the same groups described above. Of all of the $R^1$s, the content of the alkenyl group in the component (A) is preferably within a range of 0.20 to 5.00 mol % for alkenyl groups with 2 to 20 carbon atoms. $R^1$ is preferably a methyl group, vinyl group, hexenyl group, glycidoxypropyl group, or phenyl group.

In the formulas, $R^2$ independently represents an alkyl group with 1 to 20 carbon atoms, a halogen-substituted alkyl group with 1 to 20 carbon atoms, an aryl group with 6 to 20 carbon atoms, a halogen-substituted aryl group with 6 to 20 carbon atoms, and at least one group selected from a hydroxyl group or a group containing an epoxy group as expressed by the aforementioned structural formula. $R^2$ is preferably a methyl group, phenyl group, glycidoxypropyl group, or hydroxyl group.

In the formulas, $R^3$ is a straight chain or branched alkyl group (=silalkylene group) with 2 to 20 carbon atoms, bonded to a silicon atom in another siloxane unit. Examples of the alkylene group are the same groups as described above, and an ethylene group or hexylene group is preferred. Herein, bonding forms with another siloxane unit through another silalkylene are mainly as follows. Note that O on a terminal bonds to a silicon atom in another siloxane unit.

[Formula 2]

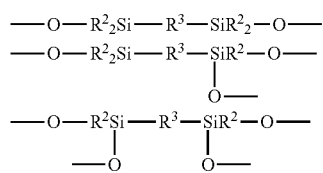

The M unit is a siloxane unit configuring a terminal of an organosilicon compound which is component (A), and the D unit is a siloxane unit configuring a straight chain polysiloxane structure. Note that the M unit or D unit is particularly preferably an alkenyl group or silicon-bonded hydrogen atom on the M unit. On the other hand, a $R^3M$ unit and $R^3D$ unit is a siloxane unit bonded to a silicon atom in another siloxane unit through a silalkylene bond, or bonded to a silicon atom in another siloxane unit through an oxygen atom. T/Q unit is a branched siloxane unit having a resin structure on a polysiloxane, and in the present invention, component (A) preferably contains at least one type of silixone unit selected from a siloxane unit as expressed by $R^2SiO_{1.5}$ and a siloxane unit as expressed by $SiO_{2.0}$. In particular, if hot melt properties of the present composition are to be further improved, the component (A) preferably contains a siloxane unit as expressed by $R^2SiO_{1.5}$, and particularly preferably contains a siloxane unit in which $R^2$ is a phenyl group, from the perspective of adjusting the amount of aryl group in the component (A).

A $R^3M/R^3D$ unit is a characteristic structure of the component (A), and represents a structure where silicon atoms are crosslinked through a silalkylene group which is $R^3$. Specifically, the unit is at least one type of siloxane unit selected from a siloxane unit containing a silalkylene group as expressed by $R^3{}_{0.5}R^2{}_2SiO_{0.5}$ and a siloxane unit containing a silalkylene group as expressed by $R^3{}_{0.5}R^2SiO_{1.0}$, and at least two of all siloxane units configuring the component (A) must be siloxane units containing a silylakylene group. A preferred bonding form between the siloxane units having a silalkylene group, which is $R^3$ is as described above, and the number of $R^3$s between two siloxane units containing a silalkylene group is expressed as a valence of "0.5" similar to an oxygen or the like in the M unit. If the number of $R^3$ is set to 1, at least one or more of structural units of siloxane as expressed by $[O_{0.5}R^2{}_2SiR^3SiR^2{}_2O_{0.5}]$, $[O_{0.5}R^2{}_2SiR^3SiR^2O_{1.0}]$, and $[O_{1.0}R^2SiR^3SiR^2O_{1.0}]$ are included in the component (A), and oxygen atoms (O) bond to silicon atoms included in the M, D, and T/Q units. By providing this structure, the component (A) can relatively easily be designed as a structure having in a molecule a chain polysiloxane structure containing the D unit and a resin polysiloxane structure containing the T/Q unit, and thus has remarkably excellent physical properties.

The component (A) can be obtained by a hydrosilylation reaction between an organopolysiloxane having at least two alkenyl groups in one molecule and an organopolysiloxane having at least two silicon-bonded hydrogen atoms in one molecule at a reaction ratio of [molar number of alkenyl groups]/[molar number of silicon-bonded hydrogen atoms]>1.

Similarly, the component can be obtained by a semicuring reaction using a peroxide between two or more organopolysiloxanes having at least two alkenyl groups in one molecule, in the presence of a peroxide at an amount insufficient for all alkenyl groups in a system to react.

The component (A) more preferably has a resin siloxane structure and chain siloxane structure in a molecule. At least a portion of a hydrosilylation reactive or peroxide curing reactive organopolysiloxane is preferably an organopolysiloxane having a resin siloxane structure, and a second portion is preferably an organopolysiloxane having a chain siloxane structure.

For example, the component (A) is an organopolysiloxane component obtained by reacting: at least one type of resin organopolysiloxane including at least one type of siloxane unit selected from a siloxane unit as expressed by $R^2SiO_{1.5}$ and siloxane unit as expressed by $SiO_{2.0}$ (where $R^2$ represents the same groups as described above) in molecule ($A^R$), and having a hydrosilylation reactive or peroxide curing reactive functional group selected from alkenyl groups with 2 to 20 carbon atoms and silicon-bonded hydrogen atoms; and at least one type of chain organopolysiloxane including a siloxane unit as expressed by $R^2{}_2SiO_{1.0}$ (where $R^2$ represents the same groups as described above) in a molecule ($A^L$), and having the component (A) and a hydrosilylation reactive or peroxide curing reactive functional group, where the reactive function group is selected from alkenyl groups with 2 to 20 carbon atoms and silicon-bonded hydrogen atoms, at a ratio set such that the alkenyl groups with 2 to 20 carbon atoms in the component ($A^R$) and component ($A^L$) remain after a hydrosilylation reaction or peroxide curing reaction.

If at least a portion of the component ($A^R$) is a resin organopolysiloxane having an alkenyl group with 2 to 20 carbon atoms, at least a portion of the component ($A^L$) is preferably a chain organopolysiloxane having a silicon-bonded hydrogen atom.

Similarly, if at least a portion of the component ($A^R$) is a resin organopolysiloxane having a silicon-bonded hydrogen atom, at least a portion of the component ($A^L$) is preferably a chain organopolysiloxane having an alkenyl group with 2 to 20 carbon atoms.

A combination thereof is not particularly restricted, but a hydrosilylation reaction is preferably performed between (a1): Organopolysiloxane having at least two alkenyl groups with 2 to 20 carbon atoms in a molecule, containing the following component (a1-1) or component (a1-2):

(a1-1) Resin organopolysiloxane containing an alkenyl group as expressed by the following structural formula

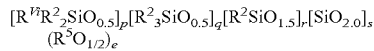

(Where $R^{Vi}$ represents an alkenyl group with 2 to 20 carbon atoms; $R^2$ represents an alkyl group with 1 to 20 carbon atoms, halogen-substituted alkyl group with 1 to 20 carbon atoms, aryl group with 6 to 20 carbon atoms, halogen-substituted aryl group with 6 to 20 carbon atoms, and at least one type of group selected from hydroxyl groups and epoxy groups; $R^5$ represents a hydrogen atom or alkyl group with 1 to 6 carbon atoms; p+q+r+s=1.0; (p+q):(r+s)=0.15 to 0.70:0.85 to 0.30; p>0; and e represents a number within a range of 0 to 0.05); and (a1-2) Chain organopolysiloxane containing an alkenyl group as expressed by the following structural formula

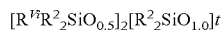

(Where $R^{Vi}$ and $R^2$ represent the same groups as described above; and t represents a number within a range of 1 to 2000), and (a2): Organohydrogen polysiloxane containing the following component (a2-1) or component (a2-2):

(a2-1) Resin or chain organohydrogen polysiloxane having a silicon-bonded hydrogen atom on a terminal of a molecular structure as expressed by the following structural formula

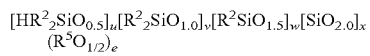

(Where $R^2$ and $R^5$ represent the same groups as described above; u+v+w+x=1.0; u:(v+w+x)=0.01 to 0.75:0.99 to 0.25; and e represents a number within a range of 0 to 0.05); and (a2-2) Chain organohydrogen polysiloxane having a silicon-bonded hydrogen atom on a side chain as expressed by the following structural formula

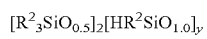

(Where $R^2$ represents the same groups as described above; and y represents a number within a range of 2 to 1000), in the presence of (a3) a hydrosilylation reaction catalyst, such that the molar number of silicon-bonded hydrogen atoms in the organohydrogen polysiloxane in the component (a2) is 0.2 to 0.7 mols with regard to 1 mol of alkenyl groups with 2 to 20 carbon atoms included in the component (a1).

The component (a1) may be a mixture of the component (a1-1) and component (a1-2) at a mass ratio of 100:0 to 0:100, and is particularly preferably independent or contains a resin organopolysiloxane containing an alkenyl group of the component (a1-1), and the mass ratio of the component (a1-1) and component (a1-2) may be 50:50 to 100:0, and is preferably within a range of 60:40 to 100:0. Note that if the component (a1) only contains the chain organopolysiloxane containing an alkenyl group of the component (a1-2), at least a portion of the component (a2) is preferably a resin organohydrogen polysiloxane of the component (a2-1).

The component (a2) may be a mixture of the component (a2-1) and component (a2-2) at a mass ratio of 100:0 to 0:100, and is particularly preferably independent or contains a resin or chain organohydrogen polysiloxane, and the mass ratio of the component (a2-1) and component (a2-2) may be 50:50 to 100:0, and is preferably within a range of 75:25 to 100:0. Note that if the component (a2) only contains the chain organohydrogen polysiloxane of the component (a2-2) at least a portion of the component (a1) is preferably a resin organopolysiloxane containing an alkenyl group of the component (a1-1).

More preferably, the component (A) can be obtained by reacting the following component (A1-1) or component (A1-2) with a component (A2) in the presence of a hydrosilylation reaction catalyst (B') or peroxide.

The component (A1-1) is a polysiloxane with a relatively high amount of branched units, which contains an alkenyl group, and is an organopolysiloxane having at least two alkenyl groups in one molecule as expressed by average unit formula:

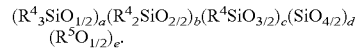

In the formula, $R^4$ represents a monovalent hydrocarbon group with 1 to 20 halogen-substituted or unsubstituted carbon atoms, and examples include alkenyl groups with 2 to 20 carbon atoms, alkyl groups with 1 to 20 carbon atoms, aryl groups with 6 to 20 carbon atoms, groups in which a portion or all hydrogen atoms bonded to these groups are substituted with a chlorine atom, bromine atom, or other halogen atom, groups containing a glycidoxypropyl group or other epoxy group, and hydroxyl groups, as described above. Methyl groups, phenyl groups, vinyl groups, hydroxyl groups, and epoxy groups are preferred. However, at least two of the $R^4$s are alkenyl groups with 2 to 20 carbon atoms. Furthermore, favorable hot melt properties can be provided by a composition obtained by having 10 mol % or more, and preferably 20 mol % or more of all $R^4$s be phenyl groups. Furthermore, $R^5$ in the formula represents a hydrogen atom or an alkyl group having from 1 to 6 carbon atoms.

In the formula, a represents a number within a range of 0 to 0.7, b represents a number within a range of 0 to 0.7, c represents a number within a range of 0 to 0.9, d represents a number within a range of 0 to 0.7, e represents a number within a range of 0 to 0.1; and c+d is a number within a range of 0.3 to 0.9, a+b+c+d is 1; and preferably a represents a number within a range of 0 to 0.6, b represents a number within a range of 0 to 0.6, c represents a number within a range of 0 to 0.9, d represents a number within a range of 0 to 0.5, e represents a number within a range of 0 to 0.05, and c+d is a number within a range of 0.4 to 0.9. This is because when a, b, and c+d is a number within the aforementioned ranges, the obtained cured product will have excellent hardness and mechanical strength.

Specific examples of this type of component (A1-1) include the following organopolysiloxanes. Note that in the formulas, Me, Ph, Vi, and Ep respectively represent a methyl group, phenyl group, vinyl group and glycidoxypropyl group.

$(ViMe_2SiO_{1/2})_{0.25}(PhSiO_{3/2})_{0.75}(HO_{1/2})_{0.02}$
$(ViMe_2SiO_{1/2})_{0.25}(PhSiO_{3/2})_{0.75}$
$(ViMe_2SiO_{1/2})_{0.20}(PhSiO_{3/2})_{0.80}$
$(ViMe_2SiO_{1/2})_{0.15}(Me_3SiO_{1/2})_{0.38}(SiO_{4/2})_{0.47}(HO_{1/2})_{0.01}$
$(ViMe_2SiO_{1/2})_{0.13}(Me_3SiO_{1/2})_{0.45}(SiO_{4/2})_{0.42}(HO_{1/2})_{0.01}$
$(ViMe_2SiO_{1/2})_{0.15}(PhSiO_{3/2})_{0.85}(HO_{1/2})_{0.01}$
$(Me_2SiO_{2/2})_{0.15}(MeViSiO_{2/2})_{0.10}(PhSiO_{3/2})_{0.75}(HO_{1/2})_{0.04}$
$(MeViPhSiO_{1/2})_{0.20}(PhSiO_{3/2})_{0.80}(HO_{1/2})_{0.05}$
$(ViMe_2SiO_{1/2})_{0.15}(PhSiO_{3/2})_{0.75}(SiO_{4/2})_{0.10}(HO_{1/2})_{0.02}$
$(Ph_2SiO_{2/2})_{0.25}(MeViSiO_{2/2})_{0.30}(PhSiO_{3/2})_{0.45}(HO_{1/2})_{0.04}$
$(Me_3SiO_{1/2})_{0.20}(ViMePhSiO_{1/2})_{0.40}(SiO_{4/2})_{0.40}(HO_{1/2})_{0.08}$
$(Me_2ViSiO_{1/2})_{0.2}(MeEpSiO_{2/2})_{0.25}(PhSiO_{3/2})_{0.55}(HO_{1/2})_{0.005}$

The component (A1-2) is a polysiloxane with a relatively high amount of chain siloxane units, containing an alkenyl group with 2 to 20 carbon atoms, and examples generally include chain polysiloxanes with 3 to 2000 mer (for example, structures containing disiloxane units within a range of 1 to 1998 and the like, in addition to terminal siloxane units on both ends). Specifically, the component (A1-2) is an organopolysiloxane having at least two alkenyl groups in one molecule expressed by average unit formula:

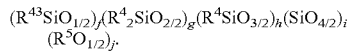

$(R^4{}_3SiO_{1/2})_f(R^4{}_2SiO_{2/2})_g(R^4SiO_{3/2})_h(SiO_{4/2})_i(R^5O_{1/2})_j$.

In the formula, $R^4$ and $R^5$ are the same groups as described above.

In the formula, f represents a number within a range of 0.001 to 0.7, g represents a number within a range of 0.3 to 0.999, h represents a number within a range of 0 to 0.2, i represents a number within a range of 0 to 0.2, j represents a number within a range of 0 to 0.1, h+I is a number within a range of 0 to 0.2, and f+g+h+i is 1; preferably, f represents a number within a range of 0.002 to 0.70, and g represents a number within a range of 0.3 to 0.998; more preferably, f represents a number within a range of 0.01 to 0.70, and g represents a number within a range of 0.3 to 0.99; and particularly preferably, f represents a number within a range of 0.01 to 0.30, and g represents a number within a range of 0.4 to 0.99. Furthermore, h preferably represents a number within a range of 0 to 0.1, i preferably represents a number within a range of 0 to 0.1, j preferably represents a number within a range of 0 to 0.05, and h+i preferably is a number within a range of 0 to 0.1. This is because when f, g, h, and i are numbers within the aforementioned ranges, toughness can be provided to the obtained cured product.

Specific examples of this type of component (A1-2) include the following organopolysiloxanes. Note that in the formulas, Me, Ph, and Vi respectively represent a methyl group, phenyl group, and vinyl group.

$ViMe_2SiO(SiMePhO)18SiMe2Vi$, in other words, $(ViMe_2SiO_{1/2})_{0.10}(MePhSiO_{2/2})_{0.90}$
$ViMe_2SiO(SiMePhO)30SiMe2Vi$, in other words, $(ViMe_2SiO_{1/2})_{0.063}(MePhSiO_{2/2})_{0.937}$
$ViMe_2SiO(SiMePhO)_{150}SiMe_2Vi$, in other words, $(ViMe_2SiO_{1/2})_{0.013}(MePhSiO_{2/2})_{0.987}$
$ViMe_2SiO(SiMe_2O)_{18}SiMe_2Vi$, in other words, $(ViMe_2SiO_{1/2})_{0.10}(Me_2SiO_{2/2})_{0.90}$
$ViMe_2SiO(SiMe_2O)_{30}SiMe_2Vi$, in other words, $(ViMe_2SiO_{1/2})_{0.063}(Me_2SiO_{2/2})_{0.937}$
$ViMe_2SiO(SiMe_2O)_{35}(SiMePhO)_{13}SiMe_2Vi$, in other words, $(ViMe_2SiO_{1/2})_{0.4}(Me_2SiO_{2/2})_{0.70}(MePhSiO_{2/2})_{0.26}$
$ViMe_2SiO(SiMe_2O)_{10}SiMe_2Vi$, in other words, $(ViMe_2SiO_{1/2})_{0.17}(Me_2SiO_{2/2})_{0.83}$
$(ViMe_2SiO_{1/2})_{0.10}(MePhSiO_{2/2})_{0.8}(PhSiO_{3/2})_{0.10}(HO_{1/2})_{0.02}$
$(ViMe_2SiO_{1/2})_{0.20}(MePhSiO_{2/2})_{0.70}(SiO_{4/2})_{0.10}(HO_{1/2})_{0.01}$
$HOMe_2SiO(MeViSiO)_{20}SiMe_2OH$
$Me_2ViSiO(MePhSiO)_{30}SiMe_2Vi$
$Me_2ViSiO(Me_2SiO)_{150}SiMe_2Vi$ The component (A1-1) is essential from the perspective of providing hardness and mechanical strength to the cured product. The component (A1-2) can be added as an optional component from the perspective of being able to provide toughness on the obtained cured product, but if the following crosslinking agent having a large number of chain siloxane units in the component (A2) is used, the component may be substituted by the crosslinking agent. In any of these cases, the mass ratio between the component having a large number of branched siloxane units and the component having a large number of chain siloxane units is preferably 50:50 to 100:0, and more preferably 60:40 to 100:0. This is because when the mass ratio between the component having a large number of branched siloxane units and component having a large number of chain siloxane units is a value within the aforementioned range, the hardness and mechanical strength of the obtained cured product are favorable.

If the component (A) of the present invention is synthesized by a peroxide curing reaction, the component (A1-1) and component (A1-2) may be reacted within a range of 10:90 to 90:10 without using the component (A2).

The component (A2) is a component for crosslinking the component (A1-1) and component (A1-2) in a hydrosilylation reaction, and is an organopolysiloxane having at least two silicon-bonded hydrogen atoms in one molecule. Examples of a group bonded to a silicon atom other than the hydrogen atom in the component (A2) include alkyl groups with 1 to 20 carbon atoms, halogen-substituted alkyl groups with 1 to 20 carbon atoms, aryl groups with 6 to 20 carbon atoms, halogen-substituted aryl groups with 6 to 20 carbon atoms, and at least one type of group selected from hydroxyl groups.

The component (A2) is not particularly restricted, but is preferably an organohydrogen polysiloxane as expressed by the average composition formula: $R^6{}_kH_mSiO_{(4-k-m)/2}$.

In the formula, $R^6$ represents a halogen-substituted or unsubstituted monovalent hydrocarbon group without an aliphatic unsaturated bonded, and examples include alkyl groups with 1 to 12 carbon atoms, aryl groups with 6 to 20 carbon atoms, aralkyl groups with 7 to 20 carbon atoms, groups in which a portion or all hydrogen atoms bonded to these groups are substituted by a chlorine atom, bromine atom, or other halogen atom, and hydroxyl groups, as described above. Methyl groups, phenyl groups, and hydroxyl groups are preferred.

Furthermore, in the formula, k represents a number within a range of 1.0 to 2.5, and preferably a number within a range of 1.2 to 2.3; m represents a number within a range of 0.01 to 0.9, and preferably a number within a range of 0.05 to 0.8; and k+m is a number within a range of 1.5 to 3.0, and preferably a number within a range of 2.0 to 2.7.

The component (A2) may be a resin organohydrogen polysiloxane having a large number of branched siloxane units, or may be an organohydrogen polysiloxane having a large number of chain siloxane units. Specific examples of the component (A2) include organohydrogen polysiloxanes as expressed by the following (A2-1) or (A2-2), and mixtures thereof.

(A2-1) Resin organohydrogen polysiloxane having a silicon-bonded hydrogen atom on a terminal of a molecular structure as expressed by the following structural formula

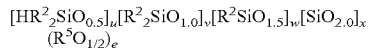

In the formula, $R^2$ represents an alkyl group with 1 to 20 carbon atoms, halogen-substituted alkyl group with 1 to 20 carbon atoms, aryl group with 6 to 20 carbon atoms, halogen-substituted aryl group with 6 to 20 carbon atoms, and at least one group selected from hydroxyl groups; $R^5$ represents a hydrogen atom or alkyl group with 1 to 6 carbon atoms; $u+v+w+x=1.0$; $u:(v+w+x)=0.01$ to $0.75:0.99$ to $0.25$; and e represents a number within a range of 0 to 0.05.

(A2-2) Chain organohydrogen polysiloxane having a silicon-bonded hydrogen atom on a side chain as expressed by the following structural formula

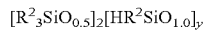

(Where $R^2$ represents the same groups as described above; and y represents a number within a range of 2 to 1000), As described above, in the composition of the present invention, the resin organopolysiloxane having a large number of branched siloxane units provides hardness and mechanical strength to the cured product, and the organopolysiloxane obtained by providing a large number of chain siloxane units provides toughness to the cured product, and therefore, the component (A2-1) and component (A2-2) can be appropriately determined as the component (A2), based on the type of the component (A). Specifically, if the number of branched siloxane units is low in the component (A1), a crosslinking agent primarily containing a resin organohydrogen polysiloxane of the component (A2-1) is preferably used as the component (A2), and if the number of chain siloxane units in the component (A1) is low, a crosslinking agent primarily containing a chain organohydrogen polysiloxane of the component (A2-2) is preferably used. The component (A2) corresponding to the component (A1) is preferably the component (A2-1), component (A2-2), or mixture thereof, where the mass ratio of the component (A2-1) and component (A2-2) is preferably 50:50 to 100:0, and more preferably 60:40 to 100:0.

Specific examples of this type of component (A2) include the following organopolysiloxanes. Note that in the formulas, Me and Ph respectively represent a methyl group and phenyl group.

$Ph_2Si(OSiMe_2H)_2$, in other words, $Ph_{0.67}Me_{1.33}H_{0.67}SiO_{0.67}$
$HMe_2SiO(Me_2SiO)_{20}SiMe_2H$, in other words, $Me_{2.00}H_{0.09}SiO_{0.95}$
$HMe_2SiO(Me_2SiO)_{55}SiMe_2H$,
$PhSi(OSiMe_2H)_3$, in other words, $Ph_{0.25}Me_{1.50}H_{0.75}SiO_{0.75}$
$(HMe_2SiO_{1/2})_{0.6}(PhSiO_{3/2})_{0.4}$, in other words, $Ph_{0.40}Me_{1.20}H_{0.60}SiO_{0.90}$ The added amount of the component (A2) is an amount where silicon-bonded hydrogen atoms is 0.2 to 0.7 mols in the component (A2), and preferably 0.3 to 0.6 mols, with regard to 1 mol of an alkenyl group with 2 to 20 carbon atoms in the component (A1-1) and component (A1-2) (hereinafter, referred to as "component (A1)"). This is because when the added amount of the component (A2) is within the aforementioned range, the initial hardness and mechanical strength of the obtained cured product are favorable.

A component (A3) is a peroxide or catalyst for a hydrosilylation reaction for promoting a semi-curing reaction of the component (A1-1) and component (A1-2) containing an alkenyl group; and the component (A2) having a silicon-bonded hydrogen atom. Examples of the component (A3) can include: peroxides for reacting the component (A1-1), the component (A1-2), and optionally, the component (A2); and catalysts for a hydrosilylation reaction for reacting the component (A2) and at least one type selected from the component (A1-1) and component (A1-2). Examples of the peroxides can include the same peroxides as the component (B) described later. On the other hand, examples of the catalysts for a hydrosilylation reaction include platinum catalysts, rhodium catalysts, and palladium catalysts, and platinum catalysts or peroxides are preferred from the perspective of being able to significantly promote curing of the present composition.

Examples of the platinum catalysts include platinum fine powders, chloroplatinic acids, alcohol solutions of a chloroplatinic acid, platinum-alkenylsiloxane complexes, platinum-olefin complexes, and platinum-carbonyl complexes, and the platinum-alkenylsiloxane complexes are particularly preferred. Examples of the alkenylsiloxane include 3-divinyl-1,1,3,3-tetramethyldisiloxane, 1,3,5,7-tetramethyl-1,3,5,7-tetravinylcyclotetrasiloxane, alkenylsiloxanes in which a portion of the methyl groups of these alkenylsiloxanes is substituted by an ethyl group, phenyl group, or the like, and alkenylsiloxanes in which the vinyl group of these alkenylsiloxanes is substituted by an allyl group, hexenyl group, or the like. The 1,3-divinyl-1,1,3,3-tetramethyldisiloxane is particularly preferred from the perspective of favorable stability of the platinum-alkenylsiloxane complex.

The added amount of the component (A3) is an amount that promotes a hydrosilylation reaction or peroxide curing reaction for the components that contribute to the reaction, selected from the component (A1-1), the component (A1-2), and the component (A2).

If the component (A3) is a catalyst for a hydrosilylation reaction, the amount of platinum metal atoms in the component is preferably within a range of 0.01 to 500 ppm by mass units, more preferably within a range of 0.01 to 100 ppm, and particularly preferably within a range of 0.01 to 50 ppm with regard to the total amount of the component (A2) and at least one type selected from the component (A1-1) and component (A1-2). This is because when the added amount of the component (A3) is higher than the lower limit of the aforementioned range, a hydrosilylation reaction of the components can be sufficiently promoted, and when lower than the upper limit of the aforementioned range, problems such as discoloring or the like of the obtained cured product are less likely to occur.

If the component (A3) is a peroxide, the amount is such that all of the reactive functional groups do not completely react while promoting a peroxide curing reaction of the component (A1-1), component (A1-2), and optionally, component (A2), and if the total amount of the component (A1-1), component (A1-2), and optionally, component (A2) is set to 100 parts by mass, the amount is within a range of 0.1 to 5 parts by mass. In particular, in the present invention, a reactive functional group such as an alkenyl group or the like must remain in the component (A) obtained by a curing or semi-curing reaction, and thus the amount is preferably within a range of 0.2 to 3 parts by mass, and more preferably with a range of 0.2 to 1.5 parts by mass.

When the components (A1) through (A3) are mixed and reacted, if the mixture or component (A) after reacting is handled in a liquid form or paste form, mixing may be performed using a kneader such as a dental mixer, Ross mixer or the like, and then adding heat to cause a reaction, but if the mixture itself or the component (A) after reacting is a solid, mixing and reacting may be performed in the presence of an organic solvent. However, the solvent must not inhibit the hydrosilylation reaction, and an alcohol solvent or a solvent having a carbon-carbon double bond has a possibility where the solvent reacts to produce a by-product. Specific examples of the solvent include: n-hexane, cyclohexane, n-heptane, and other aliphatic hydrocarbons; toluene, xylene, mesitylene, and other aromatic hydrocarbons; tetrahydrofuran, dipropyl ether, and other ethers; hexamethyl disiloxane, octamethyl trisiloxane, decamethyl tetrasiloxane, and other silicones; ethyl acetate, butyl acetate, propylene glycol monomethyl ether acetate, and other esters; and acetone, methyl ethyl ketone, methyl isobutyl ketone, and other ketones. Note that the solvent can be removed by hydrosilylation reacting and then evaporating.

The component (A) of the present invention can be synthesized by the aforementioned method, but the component (A) may also be prepared in a system by performing a hydrosilylation reaction or peroxide curing reaction in the presence of the peroxide (B) described later, or the component (A) may be synthesized in advance and then the peroxide (B) described later may be added. However, if synthesis of the component is performed in the presence of the component (B), the curing or semi-curing reaction must be a hydrosilylation reaction, and must be performed at a low reaction temperature to a degree that the component (B) is not activated. Examples of the reaction conditions include approximately 1 to 3 hours at 80 to 100° C.

Similarly, the component (A) can be obtained by reacting the following component (A4) and component (A5) in the presence of a condensation reaction catalyst (A6).

The component (A4) is a resin organopolysiloxane with a relatively high amount of branched units, and is a condensation reactive organopolysiloxane as expressed by average unit formula:

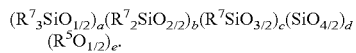

$(R^7{}_3SiO_{1/2})_a(R^7{}_2SiO_{2/2})_b(R^7SiO_{3/2})_c(SiO_{4/2})_d(R^5O_{1/2})_e.$

In the formula, $R^7$ represents a halogen-substituted or unsubstituted monovalent hydrocarbon group with 1 to 20 carbon atoms, or a condensation reactive functional group selected from a hydroxyl group, alkoxy group, and acyloxy group; and examples include alkenyl groups with 2 to 20, alkyl groups with 6 to 20 carbon atoms, groups in which a portion or all hydrogen atoms bonded to these groups is substituted by chlorine atoms, bromine atoms, and other halogen atoms, hydroxyl groups, alkoxy groups, and acyloxy groups, as described above. Methyl groups, phenyl groups, vinyl groups, hydroxyl groups, and methoxy groups are preferred. However, of all of the $R^7$s, at least one is a condensation reactive functional group. Furthermore, a phenyl group is preferably 10 mol % or more, and more preferably 20 mol % or more of all of the $R^7$s. Furthermore, $R^5$ in the formula represents a hydrogen atom or an alkyl group having from 1 to 6 carbon atoms. However, at least two of all $R^7$ are alkenyl groups with 2 to 20 carbon atoms to match component (B5) described later.

In the formula, a represents a number within a range of 0 to 0.7, b represents a number within a range of 0 to 0.7, c represents a number within a range of 0 to 0.9, d represents a number within a range of 0 to 0.7, e represents a number within a range of 0.01 to 0.10; and c+d is a number within a range of 0.3 to 0.9, a+b+c+d is 1; and preferably a represents a number within a range of 0 to 0.6, b represents a number within a range of 0 to 0.6, c represents a number within a range of 0 to 0.9, d represents a number within a range of 0 to 0.5, e represents a number within a range of 0.01 to 0.05, and c+d is a number within a range of 0.4 to 0.9. This is because when a, b and c+d are numbers within the aforementioned ranges, a hot meltable organosilicon compound can be obtained, which is a non-fluid, having low surface pressure-sensitive adhesion, and sufficiently low melt viscosity at a high temperature, while maintaining flexibility at 25° C.

The component (A5) is a chain organopolysiloxane with a relatively high amount of chain siloxane units, and is a condensation reactive organopolysiloxane as expressed by average unit formula:

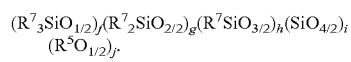

$(R^7{}_3SiO_{1/2})_f(R^7{}_2SiO_{2/2})_g(R^7SiO_{3/2})_h(SiO_{4/2})_i(R^5O_{1/2})_j.$

In the formula, $R^7$ and $R^5$ are the same groups as described above. However, of all of the $R^7$s, at least one is a condensation reactive functional group.

In the formula, f represents a number within a range of 0.001 to 0.7, g represents a number within a range of 0.3 to 0.999, h represents a number within a range of 0 to 0.2, i represents a number within a range of 0 to 0.2, j represents a number within a range of 0 to 0.1, h+1 is a number within a range of 0 to 0.2, and f+g+h+i is 1; preferably, f represents a number within a range of 0.002 to 0.70, and g represents a number within a range of 0.3 to 0.998; more preferably, f represents a number within a range of 0.01 to 0.70, and g represents a number within a range of 0.3 to 0.99; and particularly preferably, f represents a number within a range of 0.01 to 0.30, and g represents a number within a range of 0.4 to 0.99. Furthermore, h preferably represents a number within a range of 0 to 0.1, i preferably represents a number within a range of 0 to 0.1, j preferably represents a number within a range of 0 to 0.05, and h+i preferably is a number within a range of 0 to 0.1. This is because when f, g, h, and i are numbers within the aforementioned ranges, a hot meltable organosilicon compound can be obtained, which is a non-fluid, having low surface pressure-sensitive adhesion, and sufficiently low melt viscosity at a high temperature, while maintaining flexibility at 25° C.

The component (A6) is a catalyst for a condensation reaction for promoting a condensation reaction between the component (A4) and component (A5). Examples of the component (A6) include: dibutyltin dilaurate, dibutyltin diacetate, tin octenoate, dibutyltin dioctate, tin laurate, and other organic tin compounds; tetrabutyl titanate, tetrapropyl titanate, dibutoxy bis(ethyl acetoacetate), and other organic titanium compounds; hydrochloric acid, sulfuric acid, dodecyl benzene sulfuric acid, and other acidic compounds; and ammonia, sodium hydroxide, and other alkaline compounds, and organic tin compounds and organic titanium compounds are preferred.

The component (A) of the present invention can be synthesized by the aforementioned method, but the component (A) may also be prepared in a system by performing a semi-curing reaction selected from hydrosilylation reactions and condensation reactions, in the presence of the peroxide (B) described later, or one or more types of the component (A) may be synthesized in advance and then the peroxide (B) described later may be added. In any case, one or more types of a curing catalyst other than the peroxide (B) and optional peroxide (X) is included in the organopolysiloxane composition according to the present invention.

[Peroxide (Component (B))]

The curable organopolysiloxane composition according to the present invention contains one or more types of a curing catalyst other than the peroxide (B) and optional peroxide (X). The component (B) is a component that performs a crosslinking reaction at a high temperature on a reactive functional group such as an alkenyl group or the like in the hot meltable organopolysiloxane to provide a cured product, and provides characteristics where cracks are less likely to occur during curing, the coefficient of thermal expansion of the obtained cured product is low, and the physical strength is not greatly reduced even at a high temperature of 250° C. or higher. The peroxide is not particularly restricted, but is particularly preferably an organic peroxide with a 10 hour half-life temperature of 90° C. or higher from the perspective of controlling a multi-stage curing reaction and improving durability under a high temperature of 250° C. or higher. When the 10 hour half-life temperature is less than the lower limit, the synthesizing reaction of the component (A) and thermal curing reaction due to the peroxide may simultaneously occur, and improvement of hot melt properties and durability under a high temperature of 250° C. or higher may be insufficient.

Examples of the peroxide of the component (B) include peroxyalkyls, peroxydiacyls, peroxyesters, and peroxycarbonates.

Examples of the peroxyalkyls include dicumyl peroxide, di-tert-butyl peroxide, di-tert-butyl cumyl peroxide, 2,5-dimethyl-2,5-di(tert-butyl peroxy) hexane, 2,5-dimethyl-2,5-di(tert-butyl peroxy) hexane-3, tert-butyl cumyl, 1,3-bis (tert-butyl peroxy isopropyl) benzene, 3,6,9-triethyl-3,6,9-trimethyl-1,4,7-triperoxonane, and the like.

Examples of the peroxydiacyls includes benzoyl peroxide, lauroyl peroxide, decanoyl peroxide, and the like. Examples of the peroxyesters include 1,1,3,3-tetramethyl butyl peroxyneodecanoate, α-cumyl peroxyneodecanoate, tert-butyl peroxyneodecanoate, tert-butyl peroxyneoheptanoate, tert-butyl peroxypivalate, tert-hexyl peroxypivalate, 1,1,3,3-tetramethyl butyl peroxy-2-ethyl hexanoate, tert-amyl peroxyl-2-ethyl hexanoate, tert-butyl peroxy-2-ethyl hexanoate, tert-butyl peroxyisobutyrate, di-tert-butyl peroxyhexahydro terephthalate, tert-amyl peroxy 3,5,5-trimethyl hexanoate, tert-butyl peroxy 3,5,5-trimethyl hexanoate, tert-butyl peroxyacetate, tert-butyl peroxybenzoate, di-butyl peroxyltrimethyl adipate, and the like.

Examples of the peroxycarbonates include di-3-methoxybutyl peroxydicarbonate, di(2-ethylhexyl) peroxydicarbonate, diisopropyl peroxycarbonate, tert-butyl peroxyisopropyl carbonate, di(4-tert-butyl cyclohexyl) peroxydicarbonate, dicetyl peroxydicarbonate, dimyristyl peroxydicarbonate, and the like.

Of these, the peroxyalkyls are preferably used, and a peroxyalkyl with a temperature of a 10 hour half-life of 90° C. or higher, and more preferably 95° C. or higher is preferably used. Examples of the peroxides include dicumyl peroxide, di-t-butyl peroxide, di-t-hexyl peroxide, t-butyl cumyl peroxide, 2,5-dimethyl-2,5-di(tert-butyl peroxy) hexane, 1,3-bis (tert-butyl peroxyisopropyl) benzene, di-(2-t-butyl peroxyisopropyl) benzene, and 3,6,9-triethyl-3,6,9-trimethyl-1,4,7-triperoxonane.

The added amount of the component (B) is not particularly restricted, and may be within a range of 0.05 to 10 parts by mass, and preferably within a range of 0.10 to 5.0 parts by mass with regard to 100 parts by mass of the curing reactive organopolysiloxane component of component (A).

[Organohydrogen Polysiloxane (Crosslinking Agent)]

If the component (A) of the present invention is a curing reactive organopolysiloxane composition having two or more alkenyl groups in a molecule, the curable organopolysiloxane composition of the present invention may further contain an organopolysiloxane (=organohydrogen polysiloxane) having at least two silicon-bonded hydrogen atoms in one molecule. Examples of the organohydrogen polysiloxane include the same organopolysiloxanes as the aforementioned component (A2). Note that if the composition of the present invention contains a hydrosilylation reaction catalyst in a system as one or more types of a curing catalyst other than the peroxide (X) described later, the curing rate, physical properties of the cured product, and the like may be further improved by including the organohydrogen polysiloxane.

[One or More Types of Curing Catalyst (Component (X) Other than a Peroxide]

The component (X) is a curing catalyst other than the component (B), included in the curable organopolysiloxane composition of the present invention, and may be a component providing a semi-cured reaction product of chain (included straight chain or branched) organopolysiloxane and resin organopolysiloxane such as a hydrosilylation catalyst used in a process of preparing the component (A). One or more of the curing catalyst (X) other than the peroxide is included, and therefore, the hot melt properties are not impaired, and a thermal curing reaction based on the component (B) will further proceed.

The component (X) is preferably one or more type of a curing catalyst selected from a hydrosilylation reaction catalyst, condensation reaction catalyst, and high energy beam curing catalyst, similar to catalyst used in preparing the component (A).

Furthermore, high energy beam curing catalyst is a conventionally known compound that generates a radical by irradiation of a high energy beam including conventional ultraviolet rays, and may be appropriately selected from carbonyl compounds, organic sulfur compounds, azo compounds, and the like. Specific examples include acetophenone, propiophenone, benzophenone, xanthol, fluorene, benzaldehyde, anthraquinone, triphenylamine, 4-methylacetophenone, 3-pentylacetophenone, 4-methoxyacetophenone, 3-bromoacetophenone, 4-allylacetophenone, p-diacetylbenzene, 3-methoxybenzophenone, 4-methylbenzophenone, 4-chlorobenzophenone, 4,4-dimethoxybenzophenone, 4-chloro-4-benzylbenzophenone, 3-chloroxanthone, 3,9-dichloroxanthone, 3-chloro-8-nonylxanthone, benzoin, benzoinmethylether, benzoinbutyleither, bis(4-dimethylaminophenyl)ketone, benzylmethoxyketal, 2-chlorothioxanthone, diethylacetophenone, 1-hydroxycyclohexylphenylketone, 2-methyl 4-(methylthio)phenyl) 2-morpholino-1-propanone, 2,2-dimethoxy-2-phenylacetophenone, diethoxyacetophenone, and the like.

The added amount of the component (X) may be a catalytic amount required for preparing the component (A), and is the same amount as described above if the hydrosilylation reaction catalyst is used. On the other hand, for the condensation reaction catalyst and high energy beam curing catalyst, the added amount of the component (X) is not particularly restricted, and may be within a range of 0.05 to 10 parts by mass, and preferably within a range of 0.10 to 5.0 parts by mass, with regard to 100 parts by mass of the curing reactive organopolysiloxane component of component (A).

The curable organopolysiloxane composition of the present invention particularly preferably further contains (C) an inorganic filler, and if desired, (D) one or more types selected from a reaction suppressant, adhesion imparting agent, and heat resistance imparting agent, as well as other additives or phosphors. The components are described below.

[Inorganic Filler (Component (C))]

The present invention composition preferably contains an inorganic filler from the perspective of mechanical strength, functionality, and handling workability. The inorganic filler is preferably one or more types selected from reinforcing fillers, white pigments, heat conductive fillers, conductive fillers, and phosphors, and particularly preferably contains a reinforcing filler if the present invention composition is used as a sealing agent, protecting agent, or adhesive application, and thereby the coefficient of linear expansion of the cured product can be improved. Furthermore, if used in a LED wavelength converting material, a phosphor is preferably used. Furthermore, if used as a light reflecting material for an LED, a white pigment is preferably used.

The amount of the inorganic filler is not particularly restricted, but is preferably included within a range of 10 to 2000 parts by mass with regard to 100 parts by mass of the component (A), and is particularly preferably included within a range of 100 to 1500 parts by mass from the perspective of hardness and mechanical strength of the cured product.

The reinforcing filler is a component for providing mechanical strength to a cured product obtained by curing the present composition to improve performance as a protecting agent or adhesive. Examples of reinforcing filler include inorganic fillers such as fumed silica fine powder, precipitated silica fine powder, fused silica fined powder, baked silica fine powder, fumed titanium dioxide fine powder, quartz fine powder, calcium carbonate fine powder, diatomaceous earth fine powder, aluminum oxide fine powder, aluminum hydroxide powder, zinc oxide fine powder, zinc carbonate fine powder, glass fibers, carbon fibers, and the like; and the inorganic fillers may include inorganic fillers surface treated with a treating agent, such as methyl trimethoxysilane and other organoalkoxysilanes, trimethyl chlorosilane and other organohalosilanes, hexamethyl disilazanes and other organosilazanes, α, ω-silanol group-blocked dimethylsiloxane oligomers, α, ω-silanol group-block methyl phenyl siloxane oligomers, α, ω-silanol group-blocked methyl vinyl siloxane oligomers, and other siloxane oligomers, and the like. In particular, the surface of the inorganic filler may be pretreated by an organopolysiloxane with a low degree of polymerization having a silanol group on both terminals in a molecular chain, and preferably α, ω-silanol group-blocked dimethyl polysiloxane that does not have a reactive functional group other than the terminal silanol group in a molecule.

The particle size of the reinforcing filler fine powder is not particularly restricted, but can be within a median diameter range of 0.01 μm to 1000 μm based on laser diffraction scattering type particle size distribution measurement for example.

The white pigment is a component that enhances the whiteness of the present composition, and is added when a cured product thereof is used as a light reflecting material for optical semiconductor devices. Examples of the white pigment include titanium oxides, alumina, zinc oxides, zirconium oxides and magnesium oxides, and other metal oxides, barium sulfates, zinc sulfates, barium titanates, aluminum nitrides, boron nitrides, and antimony oxides, but titanium oxides are preferred from the perspective of high light reflectance and blocking properties, and alumina, zinc oxides, barium titanates are preferred from the perspective of light reflectance in the UV range. The shape and average particle size of the white pigment is not particularly restricted, but the average particle size is preferably within a range of 0.05 to 10.0 μm, and particularly preferably within a range of 0.1 to 5.0 μm. Furthermore, the white pigment may be surface treated by a silane coupling agent, silica, alumina, or the like similar to the reinforcing filler.

The heat conductive filler or conductive filler is a component that provides heat conductivity or electrical conductivity to a silicone rubber cured product obtained by curing the present composition, if desired, and examples include: gold, silver, nickel, copper, and other metal fine powders; fine powders where gold, silver, nickel, copper, or other metal is vapor deposited or plated onto a fine powder surface such as ceramics, glass, quartz, organic resins, and the like; aluminum oxides, aluminum nitrides, zinc oxides, and other metal compounds; and mixtures of two or more types thereof. Silver powder, aluminum powder, aluminum oxide powder, zinc oxide powder, aluminum nitride powder, and graphite are particularly preferred. Furthermore, if electrical insulating properties are required in the present composition, metal oxide powder or metal nitride powder is preferably used, and aluminum oxide powder, zinc oxide powder, or aluminum nitride powder is particularly preferably used.

[Phosphor]

Furthermore, the present composition may contain a phosphor in order to convert the emission wavelength from an optical semiconductor element. Examples of the phosphor include yellow, red, green, and blue light phosphors, which include oxide phosphors, oxynitride phosphors, nitride phosphors, sulfide phosphors, oxysulfide phosphors, and the like, which are widely used in light emitting diodes (LED). Examples of the oxide phosphors include yttrium, aluminum, and garnet-type YAG green to yellow light phosphors containing cerium ions, terbium, aluminum, and garnet-type TAG yellow light phosphors containing cerium ions, and silicate green to yellow light phosphors containing cerium or europium ions. Examples of oxynitride phosphors include silicon, aluminum, oxygen, and nitrogen-type SiAlON red to green light phosphors containing europium ions. Examples of nitride phosphors include calcium, strontium, aluminum, silicon, and nitrogen-type CASN red light phosphors containing europium ions. Examples of sulfide phosphors include ZnS green light phosphors containing copper ions or aluminum ions. Examples of oxysulfide phosphors include $Y_2O_2S$ red light phosphors containing europium ions. The phosphors may be used in a combination of two or more.

[One or More Types Selected from Reactive Suppressant, Adhesion Impart Agent, and Heat Resistant Imparting Agent (Component (D))]

The present composition may contain 2-methyl-3-butyn-2-ol, 3,5-dimethyl-1-hexyn-3-ol, 2-phenyl-3-butyn-2-ol, and other alkyne alcohols; 3-methyl-3-penten-1-yne, 3,5-dimethyl-3-hexen-1-yne, and other ene-yn compounds; 1,3, 5,7-tetramethyl-1,3,5,7-tetravinyl cyclotetrasiloxane, 1,3,5, 7-tetramethyl-1,3,5,7-tetrahexenyl cyclotetrasiloxane, benzotriazole; and other reaction suppressants, as other optional components.

Furthermore, the present composition may contain as another optional component an adhesion-imparting agent for improving the adhesion of thereof. The adhesion imparting agent may be an organosilicon compound having in one molecule at least one alkoxy group bonded to a silicon atom, and may be resin organopolysiloxanes or compounds having an epoxy group or the like, previously exemplified as raw materials of the component (A). This alkoxy group is exemplified by a methoxy group, an ethoxy group, a propoxy group, a butoxy group, and a methoxyethoxy group; and the methoxy group is particularly preferred. Furthermore, examples of groups other than the alkoxy group bonded to the silicon atom of the organosilicon compound include: alkyl groups, alkenyl groups, aryl groups, aralkyl groups, halogenated alkyl groups, and other halogen-substituted or unsubstituted monovalent hydrocarbon groups; 3-glycidoxypropyl groups, 4-glycidoxybutyl groups, and other glycidoxyalkyl groups; 2-(3,4-epoxycyclohexyl)ethyl groups, 3,4-(3,4-epoxycyclohexyl)propyl groups, and other epoxycyclohexylalkyl groups; 3,4-epoxybutyl groups, 7,8-epoxyoctyl groups, and other epoxyalkyl groups; 3-methacryloxypropyl groups and other acrylic group-containing monovalent organic groups; and a hydrogen atom. The organosilicon compound preferably has a group that can react with an alkenyl group or silicon atom-bonded hydrogen atom in the present composition. Specifically, the organosilicon compound preferably has a silicon atom-bonded hydrogen atom or alkenyl group. Furthermore, the organosilicon compound preferably has in one molecule at least one monovalent organic group containing an epoxy group, from the perspective of being able to provide favorable adhesion with regard to various substrates. Examples of this organosilicon compound include organosilane compounds, organosiloxane oligomers, and alkyl silicates. Examples of the molecular structure of the organosiloxane oligomer or alkyl silicate include straight chain, straight with a branched portion, branched chain, cyclic, and mesh structures, but straight chain, branched chain, and mesh structures are particularly preferred. Examples of this organosilicon compound include 3-glycidoxypropyltrimethoxysilane, 2-(3,4-epoxycyclohexyl)ethyltrimethoxysilane, 3-methacryloxy propyltrimethoxysilane, and other silane compounds; siloxane compounds having at least one of silicon-bonded alkenyl groups and silicon-bonded hydrogen atoms, and at least one silicon-bonded alkoxy group in a molecule; mixtures of a silane compound or siloxane compound having at least one silicon-bonded alkoxy group and a siloxane compound having at least one silicon-bonded hydroxyl group and at least one silicon-bonded alkenyl group in a molecule; methyl polysilicates, ethyl polysilicates, and ethyl polysilicates containing an epoxy group; carbasilatrane derivatives formed by cyclizing by an alcohol exchange reaction when reacting an alkoxysilane having an organic group containing an amino group and an alkoxysilane having an organic group containing an epoxy group, by a method described in Japanese Unexamined Patent Application No. H10-195085.; and the like. The adhesion imparting agents are preferably low-viscosity liquids, and the viscosity thereof is not particularly restricted, but is preferably within a range of 1 to 500 mPa·s at 25° C. Furthermore, in the present composition, the amount of the adhesion imparting agent is not particularly restricted, but is preferably within a range of 0.01 to 10 parts by weight with regard to a total of 100 parts by weight of the present composition.

The present composition may contain iron oxide (red oxide), cerium oxide, cerium dimethyl silanolate, a fatty acid cerium salt, cerium hydroxide, a zirconium compound, or other heat resistance imparting agent.

Furthermore, the present composition may contain: a silicone component that does not having a silicon-bonded hydrogen atom; polymethacrylate resin or other organic resin fine powder; heat resistance agent; dye; pigment other than white; flame retardancy imparting agent; or releasing agent, as other optional components, so long as an object of the present invention is not impaired.

In particular, the present invention may contain a releasing agent from the perspective of achieving favorable releasing properties from a metal during molding. The releasing agent is not particularly restricted, and a conventionally known releasing agent can be used. Specific examples include carnauba waxes, montanic acids, stearic acids, and other higher fatty acids, higher fatty acid metal salts, fatty acid ester waxes, oxidized polyethylenes, non-oxidized polyethylenes, and other polyolefin waxes, and the like. The releasing agents may be used independently as one type or may be used in a combination of two or more types. Of these, higher fatty acid metal salts and fatty acid ester waxes are preferred. Commercial products include calcium salts of stearic acid or montanic acid, magnesium salts, zinc salts, EW-440 manufactured by Riken Vitamin, and the like.

[Curable Organopolysiloxane Composition]

The curing reactive organopolysiloxane composition of the present invention contains the aforementioned components and is hot meltable. Specifically, the curing reactive organopolysiloxane composition is non-fluid at 25° C., and has a melt viscosity at 100° C. of 8000 Pa·s or lower.

Herein, non-fluid refers to a condition where a composition does not deform or flow in a condition without a load at 25° C., when molded in the form of a tablet or the like. The non-fluidity can be evaluated by placing a curing reactive organopolysiloxane composition molded onto a hot plate at 25° C., and verifying that the composition does not essentially deform or flow, either under no load or a constant load. This is because when the composition is a non-fluid at 25° C., a hot meltable organopolysiloxane can be obtained, having favorable shape retaining properties at the temperature and low surface pressure-sensitive adhesion.

The curing reactive organopolysiloxane composition of the present invention has hot melt properties, preferably has a softening point within a range of 25° C. to 100° C., and preferably does not deform or flow in a no load or constant load condition at 25° C. The softening point means that when a composition on a hot plate set within a range of 25° C. to 100° C. is continually pressed from above for 10 seconds using a 100 g load, and then the amount of deformation of the composition is measured after removing the load, the temperature when the amount of deformation in a height direction is 1 mm or more is within a range of 25° C. (however, not including 25° C.) to 100° C.

The curing reactive organopolysiloxane composition of the present invention has a melt viscosity at 100° C. that is 8,000 Pa·s or lower, 5,000 Pa·s or lower, or 4,000 Pa·s or lower, more preferably 3,750 Pa·s or lower, and most preferably with a range of 10 to 3,750 Pa·s. When within the aforementioned range, the fluidity during hot melting is favorable, and the mold flowability improves. Furthermore, a hot meltable curing reactive organopolysiloxane composition with favorable bonding to a substrate after hot melting and then cooling to 25° C. can be obtained. Herein, the melt viscosity can be measured by a rheometer AR2000EX (manufactured by TA Instruments Japan, Inc.) or the like.

The curing reactive organopolysiloxane composition of the present invention has a melt viscosity at 130° C. that is 4,000 Pa·s or lower, and particularly preferably 3,000 Pa·s or lower, 2,000 Pa·s or lower, or 1,750 Pa·s or lower. When the melt viscosity at 130° C. is within the aforementioned range in addition to the aforementioned melt properties at 100° C., a hot meltable curing reactive organopolysiloxane composition with excellent high temperature fluidity and favorable bonding to a substrate after hot melting and then cooling to 25° C. can be obtained.

Note that the non-fluidity and hot melt properties of the curing reactive organopolysiloxane composition of the present invention preferably exhibit a condition less than the softening point as measured in a softening point test method by a ring-and-ball method of a hot melt adhesive stipulated in "Test methods for softening point in hot melt adhesives" of JIS K 6863-1994. In other words, in order to be non-fluid at 25° C., it is preferable that the softening point must be higher than 25° C. This is because when the composition is non-fluid at 25° C., a hot meltable curable silicone composition can be obtained, having favorable shape retaining properties at that temperature and low surface pressure-sensitive adhesion. Furthermore, the curing reactive organopolysiloxane composition of the present invention preferably has a melt viscosity that is 3,000 Pa·s or higher at 50° C., and the melt viscosity at 50° C. is preferably 20 time or more that of the melt viscosity at 100° C., and more preferably 25 times or more. This is because when the melt viscosity at 50° C. is higher than the lower limit, or the melt viscosity at 50° C. is higher than the lower limit of the melt viscosity at 100° C., non-fluidity at 25° C., low surface pressure-sensitive adhesion, and favorable hot melt properties will be exhibited.

The curable organopolysiloxane composition of the present invention can be manufactured by uniformly mixing the aforementioned components (A), (B), (C), (D), and other optional components, but can also be manufactured by uniformly mixing the component (A) raw materials, the component (B), components (C), (D), and other optional components, and then synthesizing the component (A) in a system by heating or the like. As described above, the reaction conditions when synthesizing the component (A) is preferably approximately 80 to 100° C., where the component (B) does not activate. The method for mixing the components may be a conventionally known method and is not particularly restricted, but is normally uniform mixing by simple stirring. Furthermore, when solid components such as inorganic fillers or the like are included as optional components, mixing using a mixing device is more preferable. The mixing device is not particularly restricted, and examples include a single-screw or twin-screw continuous mixer, twin roller, Ross mixer, Hobart mixer, dental mixer, planetary mixer, kneader mixer, Henschel mixer, and the like.

The present composition preferably forms a cured product with a type D durometer hardness at 25° C. of 60 or higher. This is because when the type D durometer hardness at 25° C. of the cured product is higher than the lower limit, sufficient hardness as a sealing agent of a semiconductor or the like is exhibited. Note that the type D durometer hardness is determined based on a type D durometer in accordance with "A hardness test method of vulcanized rubber and thermoplastic rubber" of JIS K 6253-1997.

[Semiconductor Sealing Agent]

The curable organopolysiloxane composition of the present invention is advantageous as a semiconductor sealing agent, and can be used as a semi-cured (B stage) tablet for molding. General examples of a molding technique include transfer molding, injection molding, and compression molding. For example, with transfer molding, the tablet for molding can be filled into a plunger of a molding machine, and then automatic molding can be performed to obtain a molded product. Examples of the molding machine can include auxiliary ram molding machines, slide molding machines, double ram molding machines, and low pressure sealing molding machines.

In particular, the composition of the present invention can be preferably used for sealing a semiconductor element (including an optical semiconductor). The semiconductor element can be sealed by coating the composition onto the semiconductor element, and then curing the composition or the tablet. Examples of the semiconductor element include SiC, GaN, and other elements for a power semiconductor. Examples of the optical semiconductor element include elements represented by light-emitting diodes, photo diodes, photo transistors, laser diodes, and the like. In particular, the cured product formed by curing the curable organopolysiloxane composition of the present invention has excellent physical strength of an initial cured product, and can maintain high physical strength even if exposed to a high temperature of 250° C. or higher, and therefore is also preferred in applications of a SiC semiconductor powder device, requiring heat resistance exceeding 250° C.

Furthermore, the curable organopolysiloxane composition according to the present invention can be used as a light reflecting material for an optical semiconductor device, adhesive for electrical and electronics, potting agent, protecting agent, coating agent, or underfill agent.

The cured product of the present invention will now be described in detail. The cured product of the present invention is formed by curing the curable organopolysiloxane composition. The shape of the cured product of the present invention is not particularly restricted, but may be various shapes based on the used molding machine. The cured product of the present invention can be handled independently, and can also be used in a condition covering or sealing a semiconductor element, optical semiconductor element, or the like.

[Molding Method of Organopolysiloxane Cured Product]

The curable organopolysiloxane composition of the present invention has excellent hot melt properties, and forms a cured product with excellent handling workability, curing rate, and physical strength of the cured product by completely curing using a peroxide curing reaction of the component (B), and therefore is used in conventionally known hot melt transfer molding material, injection molding material, and compression molding material. In particular, the composition is preferably used in place of a semiconductor sealing agent.

Specifically, use is possible in a molding method of a cured product, at least including: (I) a step of heating and melting at 100° C. or higher, and preferably 120° C. or higher to fluidize a curable organopolysiloxane composition; (II) a step of flowing the melted curable organopolysiloxane composition of step (I) into a metal mold, and preferably a plunger of a molding machine; and (III) a step of curing the entire body by a peroxide curing reaction at 150° C. or higher, and preferably 170° C. or higher.

Practical Example

The curable organopolysiloxane composition having hot melt properties of the present invention, cured product thereof, and application thereof are described in detail using practical examples and comparative examples, but the present invention is not limited thereto. Furthermore, in the formulas, Me, Ph, Vi, and Ep respectively represent a methyl group, phenyl group, vinyl group, and epoxy group.

Measurement Method and Evaluation Criteria

The shape retaining properties, softening point, melt viscosity, presence of cracks, curing properties, adhesive strength, coefficient of thermal expansion, bending fracture strength, hardness, and heat conductivity of a curable organopolysiloxane composition were measured as follows.

[Shape Retaining Properties and Softening Point]

A composition was molded into a φ13 mm×18 mm cylindrical tablet shape. The tablet was placed on a hot plate set at 25° C., a 100 g load was continually pressed for 10 seconds from above, the load was removed, and then the amount of deformation of the composition was measured. Compositions with a deformation amount in a height direction that is less than 1 mm were labeled as "good" and compositions with a deformation amount at 1 mm or more were labeled as "poor". The results are shown in Table 2.

Furthermore, the same test was performed after changing the temperature of the hot plate, and a temperature when the composition deformed 1 mm or more was set as the softening point. The results are shown in Table 2. Furthermore, compositions that did not deform up to 150° C. were labeled as "none".

[Melt Viscosity]

The melt viscosity at 100° C. and 130° C. was measured at a shear rate of 1 (1/s) using a rheometer AR2000EX (manufactured by TA Instruments Japan, Inc.), and the results are shown in Table 2.

[Presence of Cracks]

A composition was integrally molded with a copper lead frame using a transfer molding machine to have a 35 mm length×25 mm width×1 mm height. The metal mold temperature was set to 180° C., the mold clamping time was set to 180 seconds, and after the composition was removed from the metal mold, the composition was cooled to 25° C. and then the appearance was visually checked for the presence of cracks. The results are shown in Table 2.

[Curing Properties]

The curability at 180° C. was measured using a rheometer MDR2000 (manufactured by Alpha Technologies). The times to achieve a 5% torque value and 90% torque value based on a torque value after three minutes of 100 were respectively set to T5 and T90 and measured. The results are shown in Table 2.

[Linear Expansion Coefficient of Cured Product]

A curable organopolysiloxane composition having hot melt properties was heated at 180° C. for one hour to prepare a cured product. The linear expansion coefficient of the cured product was measured within a temperature range of 30 to 300° C. using a TM 9200 manufactured by Ulvac-Riko, Inc., using a method stipulated in "Testing Method for Linear Thermal Expansion Coefficient of Plastics by Thermomechanical Analysis" of JIS K 7197-1991, and the results are shown in Table 2.

[Adhesive Strength]

A curable organopolysiloxane composition having hot melt properties was placed on an aluminum plate so as to have a diameter of 6 mm and thickness of 180 μm. An aluminum piece with a 1 mm thickness and 1 cm side was covered and clipped and then heated at 180° C. for one hour to prepare an adapter. A shear stress was applied at a rate of 10 mm/minute using a die shear tester to measure the adhesive strength, and the results are shown in Table 2.

[Hardness]

A curable organopolysiloxane composition having hot melt properties was filled into a metal mold preheated to 100° C. The metal mold was heated for three minutes at 180° C. and then cooled, and a cured product was removed. The removed cured product was further heated for one hour at 180° C. to completely curing. The hardness of the cured product was measured by a type D durometer (hereinafter, denoted as "Shore D hardness"), in accordance with "Hardness Test Method of Vulcanized Rubber and Thermoplastic Rubber" of JIS K 6253-1997, and the results are shown in Table 2.

[Bending Fracture Strength of Cured Product]

A curable organopolysiloxane composition having hot melt properties was filled into a metal mold preheated to 100° C. The metal mold was heated for three minutes at 180° C. and then cooled, and a cured product was removed. The removed cured product was further heated for one hour at 180° C. to completely curing. The bending fracture strength of the cured test body was measured in accordance with "General Test Methods of Thermosetting Plastics" of JIS K 6911-1995, which was set as an initial value. Furthermore, a similarly prepared cured test body was heated for seven days at 300° C. and then measurements were performed. The results are shown in Table 2.

[Thermal Conductivity]

A curing composition having hot melt properties was heated for one hour at 180° C. to prepare a silicone cured product. The heat resistance at 50° C. of the silicone cured product was measured by a resin material heat resistance measuring device manufactured by Hitachi, Ltd., and the heat conductivity was determined from the value thereof. The results are shown in Table 2.

Raw Material Components Used in Practical Examples/Comparative Examples

In the following practical examples and comparative examples, the following raw material components were used.

Component $A^R$-1:

average unit formula: $(Me_2ViSiO_{1/2})_{0.25}(PhSiO_{3/2})_{0.75}(HO_{1/2})_{0.02}$ Component $A^R$-2:

Toluene solution with a 50 mass % component concentration of a resin organopolysiloxane as expressed by average unit formula: $(Me_2ViSiO_{1/2})_{0.20}(PhSiO_{3/2})_{0.80}(HO_{1/2})_{0.02}$ Component $A^R$-3:

Toluene solution with a 50 mass % component concentration of a resin organopolysiloxane as expressed by average unit formula: $(MeViSiO_{2/2})_{0.25}(Ph_2SiO_{2/2})_{0.30}(PhSiO_{3/2})_{0.45}(HO_{1/2})_{0.02}$ Component $A^R$-4:

Resin organopolysiloxane (liquid) as expressed by average unit formula: $(Me_2ViSiO_{1/2})_{0.2}(MeEpSiO_{2/2})_{0.25}(PhSiO_{3/2})_{0.55}(HO_{1/2})_{0.005}$ Component $A^L$:

Molecular chain di-terminal dimethyl vinyl siloxane group-blocked methyl phenyl polysiloxane as expressed by average unit formula:

$iMe_2SiO(MePhSiO)_{18}SiViMe_2$

Component $A^H$:

Molecular chain di-terminal dimethyl hydrogen siloxane group-blocked diphenyl siloxane as expressed by average unit formula: $HMe_2SiOPh_2SiOSiMe_2H$ Component X-1:

1,3-divinyl-1,1,3,3-tetramethyl disiloxane solution of 1,3-divinyl-1,1,3,3-tetramethyl disiloxane complex of platinum Component B1: Organic peroxide Kayahexa AD manufactured by Kayaku Akzo Co., Ltd.

2,5-dimethyl-2,5-di-(t-butylperoxy) hexane 10-hour half-life temperature: 118° C.

Component B2: Organic peroxide Trigonox 117 manufactured by Kayaku Akzo Co., Ltd.

t-butylperoxy-2-ethyl hexyl carbonate 10-hour half-life temperature: 98° C.

Component B3: Organic peroxide Kayabutyl B manufactured by Kayaku Akzo Co., Ltd.

t-butylperoxy benzoate 10-hour half-life temperature: 105° C.

Component C1: Spherical silica with average particle size of 15 μm (HS-202 manufactured by Nippon Steel Materials Micron)

Component C2: Spherical alumina with average particle size of 13 μm (AS-400 manufactured by Showa Denko KK)

Component C3: Titanium oxide with average particle size of 0.5 μm (SX-3103 manufactured by Sakai Chemical Industry Co., Ltd.)

Component D1: 1,3,5,7-tetramethyl-1,3,5,7-tetravinyl cyclotetrasiloxane

Component D2:

1-ethynyl cyclohexane-1-ol

Practical Examples 1 to 7 and Comparative Examples 1 to 4

Practical example 1 is an example where synthesis of component (A) of the present invention was performed using a peroxide, and then a peroxide (B) was further added to the obtained component (A) to prepare a curable organopolysiloxane composition of the present invention.

Practical examples 2 through 7 are examples where synthesis of component (A) of the present invention was performed using a platinum catalyst (hydrosilylation reaction catalyst), and then a peroxide (B) was further added to the obtained component (A) to prepare curable organopolysiloxane compositions of the present invention.

Comparative example 1 is a comparative example where the component (A) was cured using platinum and not the component (B) (peroxide).

Comparative examples 2 and 3 are comparative examples where synthesis of the component (A) of the present invention was not performed, and raw material components were cured by a peroxide using the component (B).

Comparative example 4 is a comparative example where the peroxide was removed from practical example 4.

The amount of the components used in the practical examples/comparative examples is shown in Table 1.

Furthermore, the Ph mol % in the component (A) is shown in Table 1 for the practical examples 1 through 7 in which the component (A) is synthesized.

Furthermore, the shape retaining properties, softening point, melt viscosity, presence of cracks, curing properties, adhesive strength, coefficient of thermal expansion, bending fracture strength, hardness, and heat conductivity of the obtained cured products of the practical examples and comparative examples were measured using the aforementioned methods, and are shown in Table 2.

Practical Example 1

After mixing 109.4 parts by mass of component $A^R$-1, 36.5 parts by mass of component $A^L$, and 8.8 parts by mass of component $A^R$-4, pressure stripping was performed at 90° C., and the toluene was removed. 600 parts by mass of component C1 (filler material) and 0.8 parts by mass of component B1 (organic peroxide) were added to 100 parts by mass of the obtained liquid mixture and then mixed by a Ross mixer to prepare a paste curable organopolysiloxane composition.

When the composition was heated for 15 minutes at 180° C. and then cooled, a solid composition was obtained. The composition was heated to 100° C. and melted again into a liquid, and 5.9 parts by mass of B1 (organic peroxide) was further added and stirred in this condition, and therefore, a composition that is solid at room temperature with low surface pressure-sensitive adhesion was obtained.

Practical Example 2

After mixing 56.2 parts by mass of component $A^R$-1, 69.0 parts by mass of component $A^R$-2, 18.7 parts by mass of component $A^L$, 11.5 parts by mass of component $A^H$, and 7.2 parts by mass of component $A^R$-4, pressure stripping was performed at 90° C., and the toluene was removed. 3.6 parts by mass of component D1, component X-1 (amount where platinum metal is 2 ppm by mass unit with regard to the liquid mixture), 600 parts by mass of component C (filler material) were added to 100 parts by mass of the obtained liquid mixture, heated and mixed for 60 minutes at 100° C. by a Ross mixer, and then cooled, and thus a composition that is solid at room temperature was obtained. The composition was heated to 100° C. and melted again into a liquid, and 3.6 parts by mass of component B1 (organic peroxide) was added and stirred in this condition, and therefore, a composition that is solid at room temperature with low surface pressure-sensitive adhesion was obtained. The properties of the composition were measured similar to practical example 1.

Practical Example 3

After mixing 47.4 parts by mass of component $A^R$-1, 80.0 parts by mass of component $A^R$-2, 15.8 parts by mass of component $A^L$, 13.3 parts by mass of component $A^H$, and 7.2 parts by mass of component $A^R$-4, pressure stripping was performed at 90° C., and the toluene was removed. 3.6 parts by mass of component D1, component X-1 (amount where platinum metal is 2 ppm by mass unit with regard to the liquid mixture), 970 parts by mass of component C2 (filler material) were added to 100 parts by mass of the obtained liquid mixture, heated and mixed for 60 minutes at 100° C. by a Ross mixer, and then cooled, and thus a composition that is solid at room temperature was obtained. The composition was heated to 100° C. and melted again into a liquid, and 3.6 parts by mass of component B1 (organic peroxide) was added and stirred in this condition, and therefore, a composition that is solid at room temperature with low surface pressure-sensitive adhesion was obtained. The properties of the composition were measured similar to practical example 1.

Practical Example 4

After mixing 147.5 parts by mass of component $A^R$-1, 3.2 parts by mass of component $A^L$, 16.0 parts by mass of component AH, and 7.1 parts by mass of component $A^R$-4, pressure stripping was performed at 90° C., and toluene was removed. 3.5 parts by mass of component D1, component X-1 (amount where platinum metal is 2 ppm by mass unit with regard to the liquid mixture), 600 parts by mass of component C1 (filler material) were added to 100 parts by mass of the obtained liquid mixture, heated and mixed for 60 minutes at 100° C. by a Ross mixer, and finally, 2.1 parts by mass of component B1 (organic peroxide) was added then cooled, and therefore, a composition that is solid at room temperature with low pressure-sensitive adhesion was obtained. The properties of the composition were measured similar to practical example 1.

Practical Example 5

In example 4, a composition was similarly prepared other than 2.1 parts by mass of component B2 (organic peroxide) was added in place of component B1 to obtain a composition that is solid at room temperature with low surface pressure-sensitive adhesion. The properties of the composition were measured similar to practical example 1.

Practical Example 6

In practical example 4, a composition was similarly prepared other than 2.1 parts by mass of component B3 (organic peroxide) was added in place of component B1 to obtain a composition that is solid at room temperature with low surface pressure-sensitive adhesion. The properties of the composition were measured similar to practical example 1.

Practical Example 7

After mixing 155.4 parts by mass of component $A^R$-1, 10.4 parts by mass of component $A^L$, 11.9 parts by mass of component $A^H$, and component X-1 (amount where platinum metal is 2 ppm by mass unit with regard to the total amount of components), a reaction was performed for two hours at 100° C. while stirring, and then pressure stripping was performed at 90° C. and the toluene was removed to obtain a mixture that is solid at room temperature. When 100 parts by mass of the mixture was heated to 100° C. and melted again into a liquid, and 1.0 parts by mass of component B1 (organic peroxide), 262 parts by mass of component C1 (filler material), and 155 parts by mass of component C3 (filler material) were heated and mixed for 15 minutes at 100° C. by a Ross mixer, and thereby, a white composition that is solid at room temperature with low surface pressure-sensitive adhesion was obtained. The properties of the composition were measured similar to practical example 1.

Comparative Example 1

After mixing 38.6 parts by mass of component $A^R$-2, 103.0 parts by mass of component $A^R$-3, 23.6 parts by mass of component $A^H$, and 5.6 parts by mass of component $A^R$-4, pressure stripping was performed at 90° C., and the toluene was removed. 0.2 parts by mass of component D2, component X-1 (amount where platinum metal is 10 ppm by mass unit with regard to the liquid mixture), 600 parts by mass of component C1 (filler material) were added to 100 parts by mass of the obtained liquid mixture, mixed by a Ross mixer, and then heated for 20 minutes at 100° C., and therefore, a composition that is solid at room temperature with low surface pressure-sensitive adhesion was obtained. The properties of the composition were measured similar to practical example 1. The Shore D hardness after 7 days at 300° C. was not measurable because the test body broke during measuring.

Comparative Example 2

A curable organopolysiloxane composition was prepared similar to practical example 4, other than heating for 60 minutes at 100° C. was not performed. The obtained composition had surface pressure-sensitive adhesion. When the properties of the composition were measured similarly to practical example 1, the composition was a paste at room temperature, and therefore, the softening point was not measured.

Comparative Example 3

A composition was prepared similar to practical example 4, other than heating for 60 minutes at 180° C. was performed in place of heating for 60 minutes at 100° C., and therefore, a composition that is solid at room temperature with low surface pressure-sensitive adhesion was obtained. The properties of the composition were measured similar to practical example 1. The composition had already completely cured, and therefore, the melt viscosity and curing properties could not be measured. Therefore, the adhesive strength, thermal expansion rate, bending fracture strength, and Shore D hardness were not measured.

Comparative Example 4

A composition was prepared similar to practical example 4, other than component B1 (organic peroxide) was not added, to obtain a composition that is solid at room temperature with a low surface pressure-sensitive adhesion. The properties of the composition were measured similar to practical example 1. The composition did not cure within three minutes at 180° C. Therefore, the adhesive strength, coefficient of thermal expansion, and heat conductivity were not measured.

TABLE 1

| Practical Example/ Comparative | Practical Example | | | | | | | Comparative Examples | | | |
|---|---|---|---|---|---|---|---|---|---|---|---|
| Example No. | 1 | 2 | 3 | 4 | 5 | 6 | 7 | 1 | 2 | 3 | 4 |
| (A) $A^R$-1 (50% toluene) | 109.4 | 56.2 | 47.4 | 147.5 | 147.5 | 147.5 | 155.4 | | 147.5 | 147.5 | 109.4 |
| $A^R$-2 (50% toluene) | | 69.0 | 80 | | | | | 38.6 | | | |
| $A^R$-3 (50% toluene) | | | | | | | | 103 | | | |
| $A^R$-4 | 8.8 | 7.2 | 7.2 | 7.1 | 7.1 | 7.1 | | 5.6 | 7.1 | 7.1 | 8.8 |
| $A^L$ | 36.5 | 18.7 | 15.8 | 3.2 | 3.2 | 3.2 | 10.4 | | 3.2 | 3.2 | 36.5 |
| $A^H$ | | 11.5 | 13.3 | 16 | 16 | 16 | 11.9 | 23.6 | 16 | 16 | |
| Kayahexa AD for component (A) | 0.8 | | | | | | | | | | 0.8 |

TABLE 1-continued

| Practical Example/Comparative Example No. | | Practical Example | | | | | | | Comparative Examples | | | |
|---|---|---|---|---|---|---|---|---|---|---|---|---|
| | | 1 | 2 | 3 | 4 | 5 | 6 | 7 | 1 | 2 | 3 | 4 |
| (X1) Pt catalyst | | 2 ppm | 2 ppm | 2 ppm | 2 ppm | 2 ppm | 2 ppm | 2 ppm | 10 ppm | 2 ppm | 2 ppm | |
| Pre-synthesis of component (A) | | Yes | Yes | Yes | Yes | Yes | Yes | Yes | Yes | No | No 180° C.-60 minutes | Yes |
| Ph mol % of component (A) | | 46 | 47 | 47 | 45 | 45 | 45 | 46 | — | 45 | 45 | — |
| (B) | (B1) Kayahexa AD | 5.9 | 3.6 | 3.6 | 2.1 | | | 1 | | 2.1 | 2.1 | |
| | (B2) Trigonox 117 | | | | | 2.1 | | | | | | |
| | (B3) Kayabutyl B | | | | | | 2.1 | | | | | |
| (C) | C1: Spherical silica | 600 | 600 | | 600 | 600 | 600 | 262 | 600 | 600 | 600 | 600 |
| | C2: Spherical alumina | | | 970 | | | | | | | | |
| | C3: Titanium oxide | | | | | | | 155 | | | | |
| (D) | D1 | | 3.6 | 3.6 | 3.5 | 3.5 | 3.5 | | | 3.5 | 3.5 | |
| | D2 | | | | | | | 0.2 | | | | |

TABLE 2

| Criterion | | Practical Example | | | | | | | Comparative Examples | | | |
|---|---|---|---|---|---|---|---|---|---|---|---|---|
| | | 1 | 2 | 3 | 4 | 5 | 6 | 7 | 1 | 2 | 3 | 4 |
| Shape Retaining Properties | | Good | Good | Good | Good | Good | Good | Good | Good | Poor | Good | Good |
| Softening point ° C. | | 50 | 45 | 50 | 55 | 55 | 55 | 55 | 55 | [2] Not measured | No | 55 |
| Melt viscosity 100° C. Pa·s | | 1450 | 990 | 3500 | 1200 | 1230 | 1180 | 1620 | 850 | 100 | [3] Not measurable | 2410 |
| Melt viscosity 130° C. Pa·s | | 1100 | 930 | 1450 | 850 | 880 | 850 | 1280 | 620 | 50 | | 1250 |
| Presence of Cracks | | None | None | None | None | None | None | None | Yes | None | [4] Not measurable | [6] Not measurable |
| Curability | t 10 at 180° C. (min:sec) | 0:31 | 0:31 | 0:37 | 0:41 | 0:18 | 0:25 | 0:40 | 0:34 | 0:59 | | |
| | t 90 at 180° C. (min:sec) | 1:25 | 1:28 | 2:03 | 1:40 | 0:58 | 1:19 | 1:55 | 2:30 | 2:04 | | |
| Properties of Cured Product | Adhesive Strength MPa | 8 | 6 | 4 | 6 | 7 | 4 | 4 | 4 | 6 | [5] Not measured | — |
| | Coefficient of Thermal Expansion ppm/° C. | 39 | 40 | 43 | 43 | 40 | 46 | 48 | 50 | 47 | | — |
| | Heat conductivity W/mK | 0.9 | 0.9 | 2.8 | 0.9 | 0.9 | 0.9 | 0.7 | 0.9 | 0.9 | | — |
| Initial | Bending Fracture Strength Mpa | 21 | 34 | 49 | 44 | 39 | 24 | 37 | 36 | 26 | | 5 |
| | Shore D Hardness | 88 | 93 | 94 | 94 | 93 | 93 | 88 | 92 | 92 | | 75 |

TABLE 2-continued

| Criterion | | Practical Example | | | | | | | Comparative Examples | | | |
|---|---|---|---|---|---|---|---|---|---|---|---|---|
| | | 1 | 2 | 3 | 4 | 5 | 6 | 7 | 1 | 2 | 3 | 4 |
| 300° C.-7 days | Bending Fracture Strength Mpa | 27 | 40 | 57 | 40 | 46 | 18 | 33 | 5 | 14 | | 10 |
| | Shore D Hardness | 96 | 96 | 96 | 93 | 95 | 95 | 92 | 1) Not measurable | 92 | | 92 |

In Table 2, the physical values of the compositions in the comparative examples were not measured or could not be measured due to the following reasons.

1) The test piece broke during measurements, and therefore could not be measured.

2) There were no shape retaining properties due to being a paste at room temperature, and therefore, measurements were not performed.

3), 4) The test body completely cured, and did not melt, and therefore could not be measured.

5) There were no heat softening properties, and therefore, the pieces were labeled as having no hot melt properties, and measurements were omitted.

6) There was no curing reactivity, and therefore, measurements could not be performed.

As shown in Table 2, the compositions according to the practical examples of the present invention had very excellent favorable hot melt properties, quick high temperature curability, and adhesion/coefficient of thermal expansion/heat conductivity and other various properties of a cured product, excellent physical strength of an initial cured product, that is less likely to crack during curing, and that maintains high physical strength even if exposed to a high temperature of 250° C. or higher.

On the other hand, all of the compositions according to comparative examples have problems where hot melt properties are not provided, curability is insufficient, and the like, in addition insufficient toughness such as bending fracture strength and the like when exposed to a high temperature of 250° C. or higher, and thus do not cover the curability of the practical examples of the present invention, and properties of a cured product.

The invention claimed is:

1. A curable organopolysiloxane composition, comprising:
   (A) a curing reactive organopolysiloxane component having at least two carbon-carbon double bonds per molecule and formed by semi-curing and reacting a resin organopolysiloxane and chain organopolysiloxane in the presence of a hydrosilylation reaction catalyst, wherein the curing reactive organopolysiloxane component comprises an organopolysiloxane in which 10 mol % or more of all silicon-atom bonded organic groups are aryl groups; and
   (B) an organic peroxide selected from the group consisting of peroxyalkyls, peroxydiacyls, peroxyesters, and peroxycarbonates;
      wherein the organic peroxide (B) has a 10 hour half-life temperature of 90° C. or higher;
      wherein semi-curing and reacting of component (A) is carried out at a temperature of approximately 80 to 100° C.; and
      wherein the composition is non-fluid at 25° C., and the melt viscosity at 100° C. is 8000 Pa·s or lower.

2. The curable organopolysiloxane composition according to claim 1, wherein the organic peroxide (B) is a peroxyalkyl.

3. The curable organopolysiloxane composition according to claim 1, further comprising: (C) an inorganic filler.

4. The curable organopolysiloxane composition according to claim 1, further comprising: one or more components selected from a reaction suppressant, an adhesion imparting agent, and a heat resistance imparting agent.

5. The curable organopolysiloxane composition according to claim 1, having a softening point within a range of 25° C. to 100° C.

6. The curable organopolysiloxane composition according to claim 1, wherein the melt viscosity at 100° C. is 500 to 8000 Pa·s.

7. The curable organopolysiloxane composition according to claim 1, wherein when the torque value after 180° C./3 min is 100%, the time to reach 90% is less than 2 minutes and 30 seconds.

8. The curable organopolysiloxane composition according to claim 1, wherein a type D durometer hardness at 25° C. of a cured product obtained by curing the curable organopolysiloxane composition is 60 or higher.

9. The curable organopolysiloxane composition according to claim 1, wherein the coefficient of linear expansion of a cured product obtained by curing the curable organopolysiloxane composition is 100 ppm/° C. or lower.

10. A cured product formed by curing the curable organopolysiloxane composition according to claim 1.

11. A light-reflecting material for a semiconductor or optical semiconductor, said light-reflecting material comprising the cured product according to claim 10.

12. The light-reflecting material according to claim 11, wherein the semiconductor or optical semiconductor is a power semiconductor.

13. A semiconductor device comprising the cured product according to claim 10.

14. The semiconductor device of claim 13, further comprising a semiconductor element and wherein the cured product seals the semiconductor element.

15. The semiconductor device of claim 13, further defined as an optical semiconductor device or a power semiconductor device.

16. A sealing agent for a semiconductor, said sealing agent comprising the curable organopolysiloxane composition according to claim 1.

17. A method of molding a cured product, said method comprising:
   (I) heating and melting at 100° C. or higher to fluidize the curable organopolysiloxane composition according to claim 1 to give a melted curable organopolysiloxane composition;
   (II) flowing into a metal die the melted curable organopolysiloxane composition; and (III) curing the melted curable organopolysiloxane composition in the metal die by peroxide curing at 150° C. or higher.

18. The curable organopolysiloxane composition according to claim 1, wherein the curing reactive organopolysiloxane component comprises an organopolysiloxane in which 10 mol % or more and 47 mol % or less of all silicon-atom bonded organic groups are aryl groups.

* * * * *